United States Patent
Mieher

(10) Patent No.: US 10,401,740 B2
(45) Date of Patent: Sep. 3, 2019

(54) SYSTEM AND METHOD FOR FOCUS DETERMINATION USING FOCUS-SENSITIVE OVERLAY TARGETS

(71) Applicant: KLA-Tencor Corporation, Milpitas, CA (US)

(72) Inventor: Walter Dean Mieher, Los Gatos, CA (US)

(73) Assignee: KLA-Tencor Corporation, Milpitas, CA (US)

( * ) Notice: Subject to any disclaimer, the term of this patent is extended or adjusted under 35 U.S.C. 154(b) by 0 days.

(21) Appl. No.: 15/154,051

(22) Filed: May 13, 2016

(65) Prior Publication Data

US 2016/0334716 A1   Nov. 17, 2016

Related U.S. Application Data

(60) Provisional application No. 62/162,573, filed on May 15, 2015.

(51) Int. Cl.
*G03F 1/44* (2012.01)
*G03F 7/20* (2006.01)

(52) U.S. Cl.
CPC ............ *G03F 7/70641* (2013.01); *G03F 1/44* (2013.01); *G03F 7/70683* (2013.01)

(58) Field of Classification Search
CPC .......... G03F 7/70641; G03F 1/44; G03F 1/50; G03F 7/70683; G03F 7/70733; H04N 5/2254; H04N 5/2256
See application file for complete search history.

(56) References Cited

U.S. PATENT DOCUMENTS

| | | | |
|---|---|---|---|
| 5,300,786 A | * | 4/1994 | Brunner .................... G03F 1/26 250/548 |
| 5,608,526 A | | 3/1997 | Piwonka-Corle et al. |
| 5,859,424 A | | 1/1999 | Norton et al. |
| 6,429,943 B1 | | 8/2002 | Opsal et al. |

(Continued)

FOREIGN PATENT DOCUMENTS

JP     2005070672 A     3/2005

OTHER PUBLICATIONS

C. Wong et al., CD optimization methodology for extending optical lithography, Metrology, Inspection, and Process Control for Microlithography XXVII, Proc. to SPIE vol. 8681, Apr. 2013, 11 pages.

(Continued)

*Primary Examiner* — Deoram Persaud
(74) *Attorney, Agent, or Firm* — Suiter Swantz pc llo

(57) ABSTRACT

A lithography mask is disclosed. The lithography mask includes at least one asymmetric segmented pattern element. A particular asymmetric segmented pattern element includes at least two segments with a separation distance between consecutive segments smaller than a resolution of a set of projection optics for generating an image of the particular asymmetric segmented pattern element on a sample such that the image of the particular asymmetric segmented pattern element is an unsegmented pattern image. A position of the unsegmented pattern image on the sample is indicative of a location of the sample along an optical axis of the set of projection optics.

30 Claims, 14 Drawing Sheets

(56) References Cited

U.S. PATENT DOCUMENTS

| | | | |
|---|---|---|---|
| 6,433,878 B1* | 8/2002 | Niu | G03F 7/70441 |
| | | | 356/392 |
| 6,602,728 B1* | 8/2003 | Liebmann | G03F 1/36 |
| | | | 438/14 |
| 6,673,638 B1 | 1/2004 | Bendik et al. | |
| 6,884,552 B2 | 4/2005 | Mieher et al. | |
| 6,985,618 B2 | 1/2006 | Adel et al. | |
| 7,352,453 B2 | 4/2008 | Mieher et al. | |
| 7,382,447 B2 | 6/2008 | Mieher et al. | |
| 7,408,642 B1* | 8/2008 | DiBiase | G03F 9/7076 |
| | | | 356/399 |
| 7,478,019 B2 | 1/2009 | Zangooie et al. | |
| 7,545,520 B2 | 6/2009 | Lee et al. | |
| 7,564,557 B2 | 7/2009 | Mieher et al. | |
| 9,594,299 B2* | 3/2017 | Hinnen | G03F 1/44 |
| 9,952,517 B2* | 4/2018 | Vernna; Alok | G01N 21/4738 |
| 10,018,919 B2* | 7/2018 | Lee | G03F 7/70283 |
| 10,095,122 B1* | 10/2018 | Lee | G03F 7/70633 |
| 10,228,320 B1 | 3/2019 | Levinski | G01N 21/01 |
| 2003/0026471 A1* | 2/2003 | Adel | G03F 7/70633 |
| | | | 382/144 |
| 2007/0076205 A1* | 4/2007 | Schulz | G03F 7/70633 |
| | | | 356/401 |
| 2007/0141477 A1* | 6/2007 | Lin | G03F 1/36 |
| | | | 430/5 |
| 2008/0018874 A1* | 1/2008 | Dusa | G03F 7/70516 |
| | | | 355/55 |
| 2008/0111995 A1 | 5/2008 | Lee et al. | |
| 2008/0138588 A1* | 6/2008 | Schroeder | G03F 1/36 |
| | | | 428/195.1 |
| 2009/0135390 A1* | 5/2009 | La Fontaine | G03F 7/70125 |
| | | | 355/67 |
| 2011/0249247 A1* | 10/2011 | Cramer | G03F 1/14 |
| | | | 355/55 |
| 2011/0273685 A1* | 11/2011 | Li | G03B 21/26 |
| | | | 355/53 |
| 2012/0044472 A1 | 2/2012 | Den Boef et al. | |
| 2013/0295698 A1 | 11/2013 | Pforr et al. | |
| 2013/0326434 A1* | 12/2013 | Feng | G03F 1/36 |
| | | | 716/52 |
| 2013/0336572 A1* | 12/2013 | Choi | G06T 7/0004 |
| | | | 382/144 |
| 2014/0007024 A1* | 1/2014 | Tsai | G06F 17/5068 |
| | | | 716/52 |
| 2014/0141536 A1* | 5/2014 | Levinski | G03F 7/70641 |
| | | | 438/5 |
| 2015/0017571 A1* | 1/2015 | Chang | G03F 1/38 |
| | | | 430/5 |
| 2017/0177760 A1* | 6/2017 | Socha | G01N 21/4785 |

OTHER PUBLICATIONS

S. Higashibata et al., Improvement of focus accuracy on processed wafer, Metrology, Inspection, and Process Control for Microlithography XXVII, Proc. of Spie vol. 8681, Apr. 2013, 7 pages.

La Fontaine et al., Analysis of focus errors in lithography using phase-shift monitors, Proc. SPIE 4691, Microlithography XV, Jul. 15, 2002, 10 pages.

Christopher P. Ausschnitt, Distinguishing dose from defocus for in-line lithography control, Metrology, Inspection, and Process Control for Microlithography XIII, Spie vol. 3677, Mar. 1999, 8 pages.

PCT International Search Report for Application No. PCT/US2016/032533 dated Aug. 17, 2016, 3 pages.

* cited by examiner

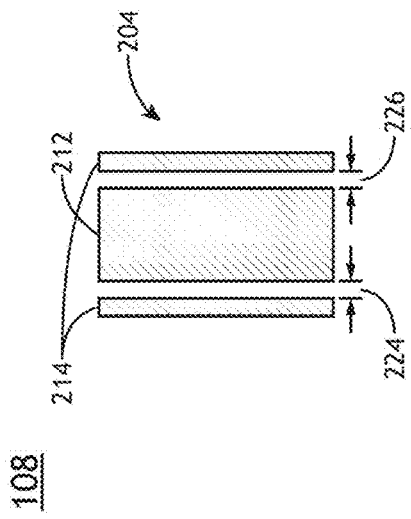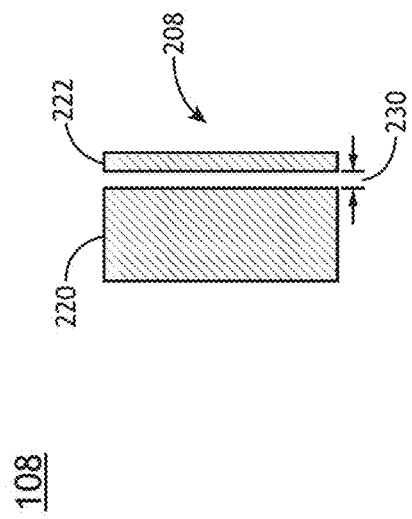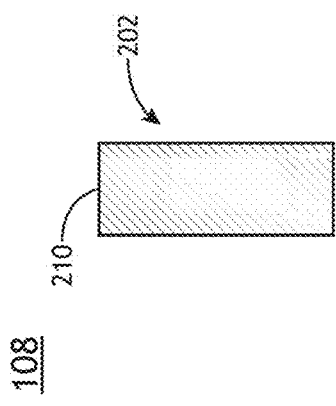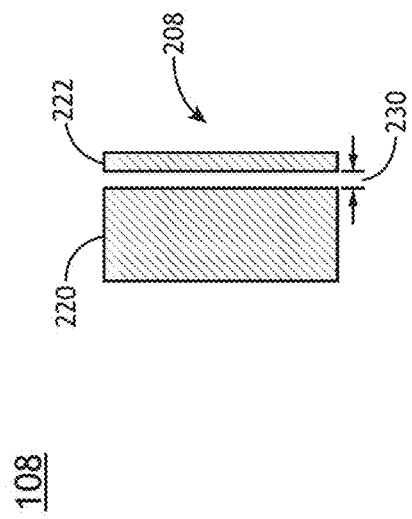

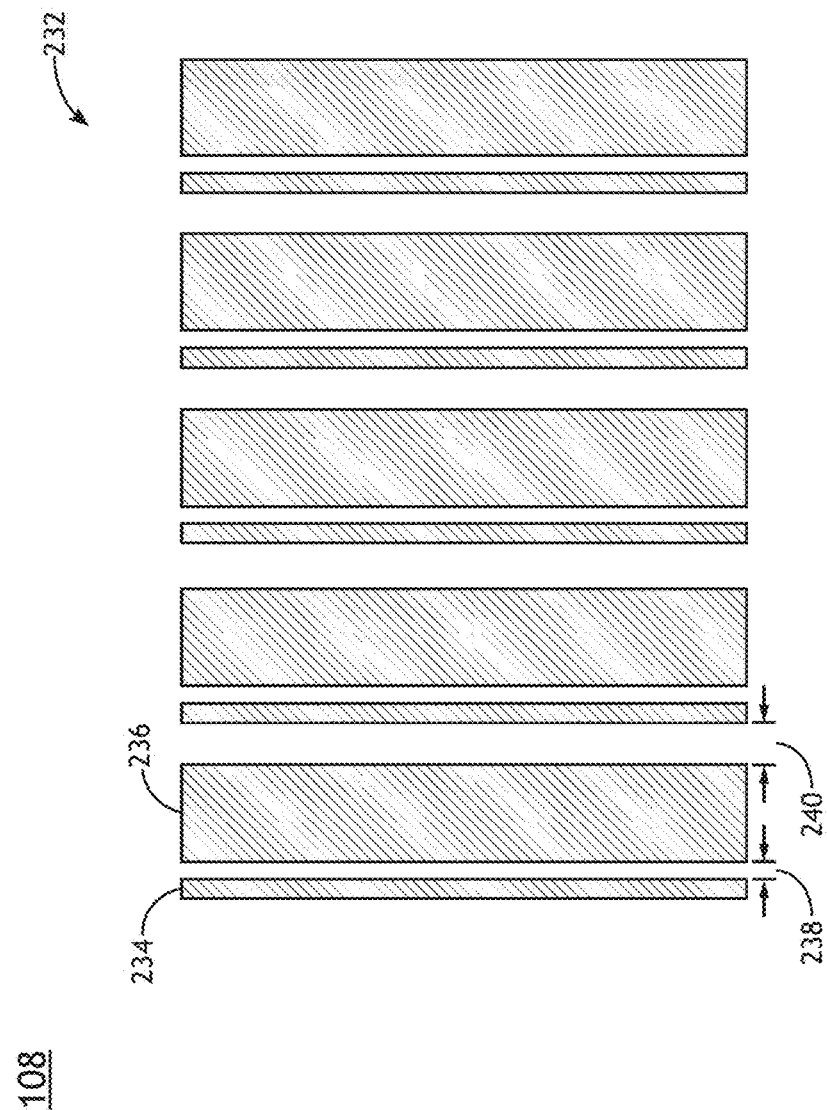

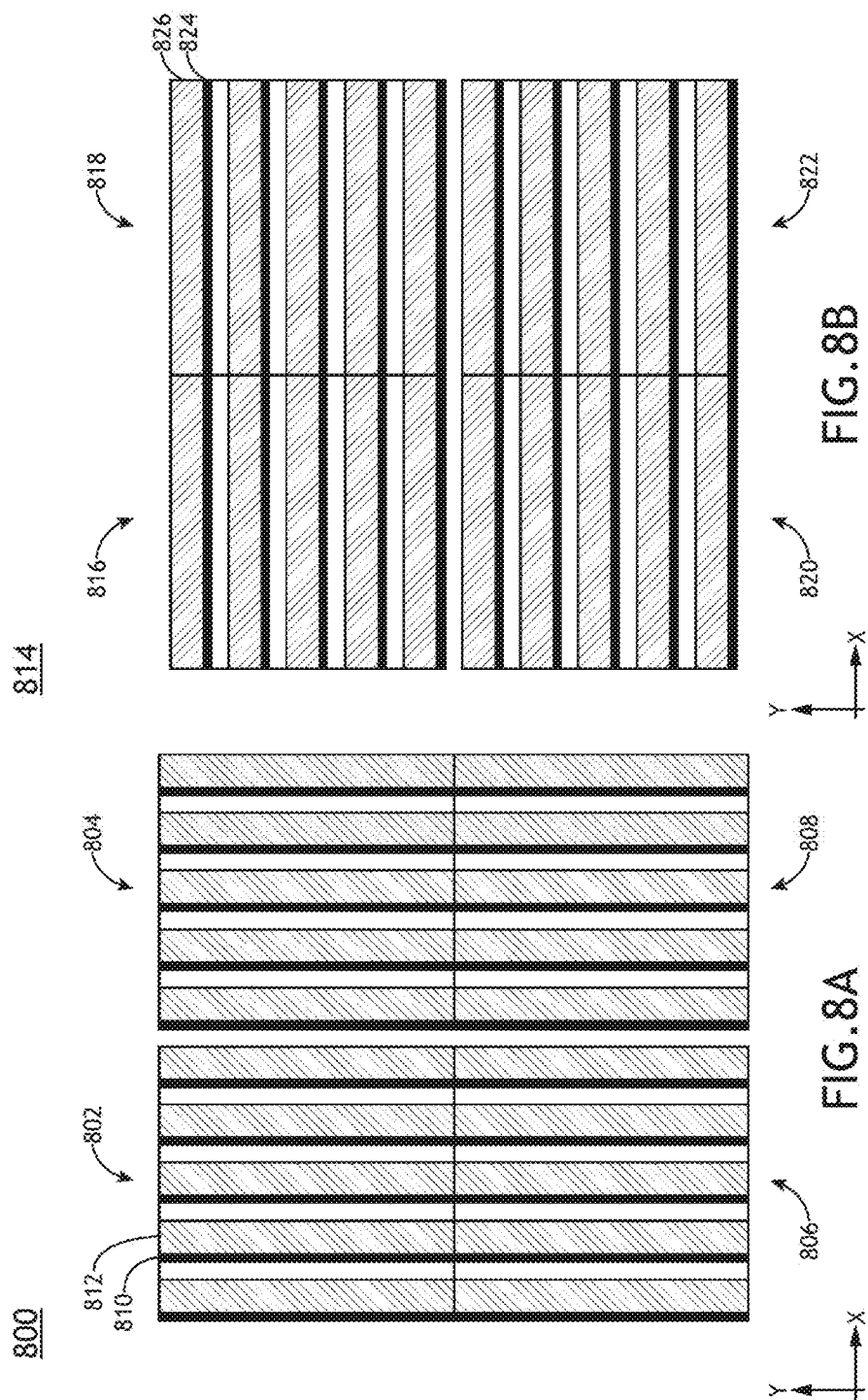

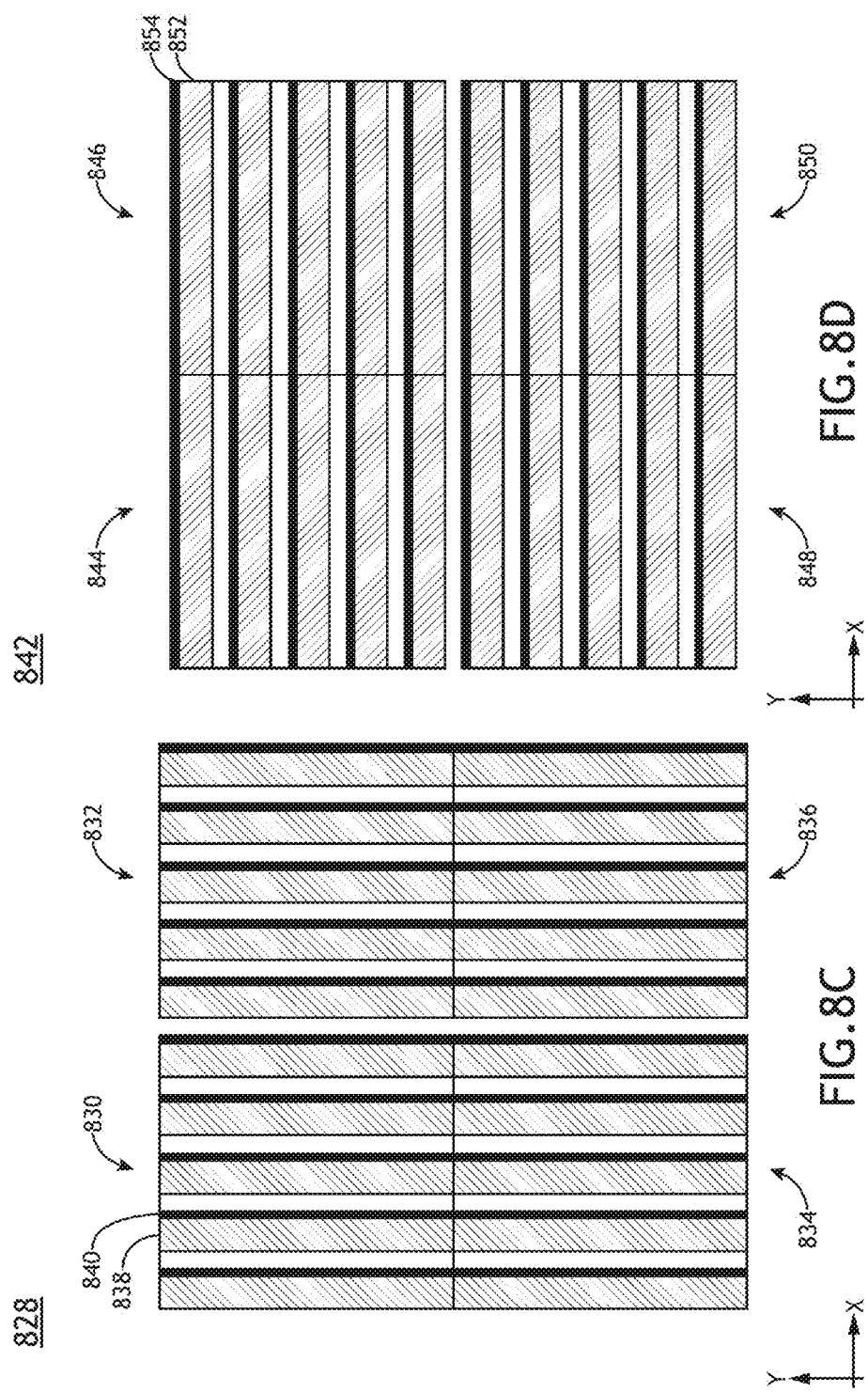

900

902 — GENERATING AN IMAGE OF A LITHOGRAPHY MASK WITH A SET OF PROJECTION OPTICS, WHEREIN THE LITHOGRAPHY MASK INCLUDES AT LEAST ONE ASYMMETRIC SEGMENTED PATTERN ELEMENT, WHEREIN THE IMAGE OF A PARTICULAR ASYMMETRIC SEGMENTED PATTERN ELEMENT IS AN UNSEGMENTED PATTERN IMAGE, WHEREIN A POSITION OF THE UNSEGMENTED PATTERN IMAGE ON THE SAMPLE IS INDICATIVE OF A LOCATION OF THE SAMPLE ALONG AN OPTICAL AXIS OF THE SET OF PROJECTION OPTICS

904 — MEASURING THE POSITION OF THE UNSEGMENTED PATTERN IMAGE ASSOCIATED WITH THE PARTICULAR ASYMMETRIC SEGMENTED PATTERN ELEMENT USING A METROLOGY TOOL

906 — DETERMINING THE LOCATION OF THE SAMPLE ALONG THE OPTICAL AXIS OF THE SET OF PROJECTION OPTICS BASED ON THE MEASURED POSITION OF THE UNSEGMENTED ELEMENT

FIG.9

SYSTEM AND METHOD FOR FOCUS DETERMINATION USING FOCUS-SENSITIVE OVERLAY TARGETS

CROSS-REFERENCE TO RELATED APPLICATION

The present application claims the benefit under 35 U.S.C. § 119(e) of U.S. Provisional Application Ser. No. 62/162,573, filed May 15, 2015, entitled FOCUS-SENSITIVE OVERLAY TARGETS AND MEASUREMENT METHODS, naming Walter Dean Mieher as inventor, which is incorporated herein by reference in the entirety.

TECHNICAL FIELD

The present disclosure relates generally to metrology, and more particularly, to metrology targets generated with focus-sensitive pattern masks.

BACKGROUND

Semiconductor wafers must be accurately placed within the focal region of lithography tools within tight tolerances to properly write features having narrow linewidths and high densities. Focus-sensitive metrology targets are specialized marks patterned onto the wafer during a lithography step in which one or more characteristics of the mark (e.g. alignment of two features) is indicative of the focal position of the wafer during the lithography step. Focus sensitive metrology targets are typically generated as images of pattern masks generated by the lithography tool. In this way, focus-sensitive pattern masks contain one or more pattern elements that, when imaged on the wafer, provide measurably distinct variations corresponding to deviations of the focal position of the wafer from a nominal focal position.

Further, it is desirable that pattern masks used to generate focus-sensitive metrology targets to be used in a semiconductor fabrication line be cost-effective and integrate with the pattern masks used to write the semiconductor devices under production. Therefore, it would be desirable to provide a system and method for curing defects such as those identified above.

SUMMARY

A lithography mask is disclosed in accordance with one or more illustrative embodiments of the present disclosure. In one illustrative embodiment, the lithography mask includes at least one asymmetric segmented pattern element. In another illustrative embodiment, a particular asymmetric segmented pattern element includes at least two segments. In another illustrative embodiment, a separation distance between consecutive segments of the particular asymmetric segmented pattern element is configurable to be smaller than a resolution of a set of projection optics for generating an image of the particular asymmetric segmented pattern element on a sample such that the image of the particular asymmetric segmented pattern element is an unsegmented pattern image. In another illustrative embodiment, a position of the unsegmented pattern image on the sample is indicative of a location of the sample along an optical axis of the set of projection optics.

A lithography system is disclosed in accordance with one or more illustrative embodiments of the present disclosure. In one illustrative embodiment, the lithography system includes a mask support device configured to secure a lithography mask. In another illustrative embodiment, the lithography system includes an illumination source configured to direct illumination to the lithography mask. In another illustrative embodiment, the lithography system includes a set of projection optics configured to generate an image of the lithography mask on a sample. In another illustrative embodiment, the mask includes at least one asymmetric segmented pattern element. In another illustrative embodiment, a particular asymmetric segmented pattern element includes at least two segments. In another illustrative embodiment, a separation distance between consecutive segments of the particular asymmetric segmented pattern element is configurable to be smaller than a resolution of the set of projection optics such that the image of the particular asymmetric segmented pattern element is an unsegmented pattern image. In another illustrative embodiment, a position of the unsegmented pattern image on the sample is indicative of a location of the sample along an optical axis of the set of projection optics.

A metrology system is disclosed, in accordance with one or more illustrative embodiments of the present disclosure. In one illustrative embodiment, the metrology system includes a sample stage configured to support a substrate with a metrology target disposed upon the substrate. In another illustrative embodiment, the metrology target is associated with an image of a lithography mask, wherein the lithography mask includes at least one asymmetric segmented pattern element. In another illustrative embodiment, a particular asymmetric segmented pattern element includes at least two segments. In another illustrative embodiment, a separation distance between consecutive segments of the particular asymmetric segmented pattern element is configurable to be smaller than a resolution of a set of projection optics for generating an image of the particular asymmetric segmented pattern element on a sample such that the image of the particular asymmetric segmented pattern element is an unsegmented pattern image. In another illustrative embodiment, a position of the unsegmented pattern image on the sample is indicative of a location of the sample along an optical axis of the set of projection optics. In another illustrative embodiment, the metrology system includes at least one illumination source configured to illuminate the metrology target. In another illustrative embodiment, the metrology system includes at least one detector configured to receive illumination from the metrology target. In another illustrative embodiment, the metrology system includes at least one controller communicatively coupled to the detector and configured to determine a location of the sample along an optical axis of the set of projection optics based on a position of the unsegmented pattern image.

A method for determining a position of a sample along an optical axis of a lithography system is disclosed in accordance with one or more illustrative embodiments of the present disclosure. In one illustrative embodiment, the method includes generating an image of a lithography mask with a set of projection optics. In another illustrative embodiment, the mask includes at least one asymmetric segmented pattern element. In another illustrative embodiment, a particular asymmetric segmented pattern element includes at least two segments. In another illustrative embodiment, a separation distance between consecutive segments of the particular asymmetric segmented pattern element is configurable to be smaller than a resolution of a set of projection optics for generating an image of the particular asymmetric segmented pattern element on a sample such that the image of the particular asymmetric segmented pattern element is an unsegmented pattern image.

In another illustrative embodiment, a position of the unsegmented pattern image on the sample is indicative of a location of the sample along an optical axis of the set of projection optics. In another illustrative embodiment, the method includes measuring the position of the unsegmented pattern image associated with the particular asymmetric segmented pattern element using a metrology tool. In another illustrative embodiment, the method includes determining a location of the sample along an optical axis of the set of projection optics associated with the generation of the image of the lithography mask on the sample based on the measured position of the unsegmented element.

It is to be understood that both the foregoing general description and the following detailed description are exemplary and explanatory only and are not necessarily restrictive of the invention as claimed. The accompanying drawings, which are incorporated in and constitute a part of the specification, illustrate embodiments of the invention and together with the general description, serve to explain the principles of the invention.

BRIEF DESCRIPTION OF DRAWINGS

The numerous advantages of the disclosure may be better understood by those skilled in the art by reference to the accompanying figures in which:

FIG. 2A is a block diagram illustrating an unsegmented pattern element including a single segment, in accordance with one or more embodiments of the present disclosure.

FIG. 2B is a block diagram illustrating a symmetric segmented pattern element including a first segment adjacent to two additional segments in accordance with one or more embodiments of the present disclosure.

FIG. 2C is a block diagram illustrating a left-asymmetric pattern element including a first segment and an additional segment to the left of the first element in accordance with one or more embodiments of the present disclosure.

FIG. 2D is a block diagram illustrating a right-asymmetric pattern element including a first segment and an additional segment to the right of the first element in accordance with one or more embodiments of the present disclosure.

FIG. 2E is a block diagram illustrating a composite segmented pattern element including a periodic distribution of segments, in accordance with one or more embodiments of the present disclosure.

FIG. 8A illustrates a focus-sensitive pattern mask including a set of asymmetric pattern elements, in accordance with one or more embodiments of the present disclosure.

FIG. 8B illustrates a focus-sensitive pattern mask including a set of asymmetric pattern elements, in accordance with one or more embodiments of the present disclosure.

FIG. 8C illustrates a focus-sensitive pattern mask including a set of asymmetric pattern elements, in accordance with one or more embodiments of the present disclosure.

FIG. 8D illustrates a focus-sensitive pattern mask including a set of asymmetric pattern elements, in accordance with one or more embodiments of the present disclosure.

FIG. 9 is a flow diagram illustrating steps performed in a method for determining a position of a sample along an optical axis of a lithography system.

DETAILED DESCRIPTION

Figure 1A:
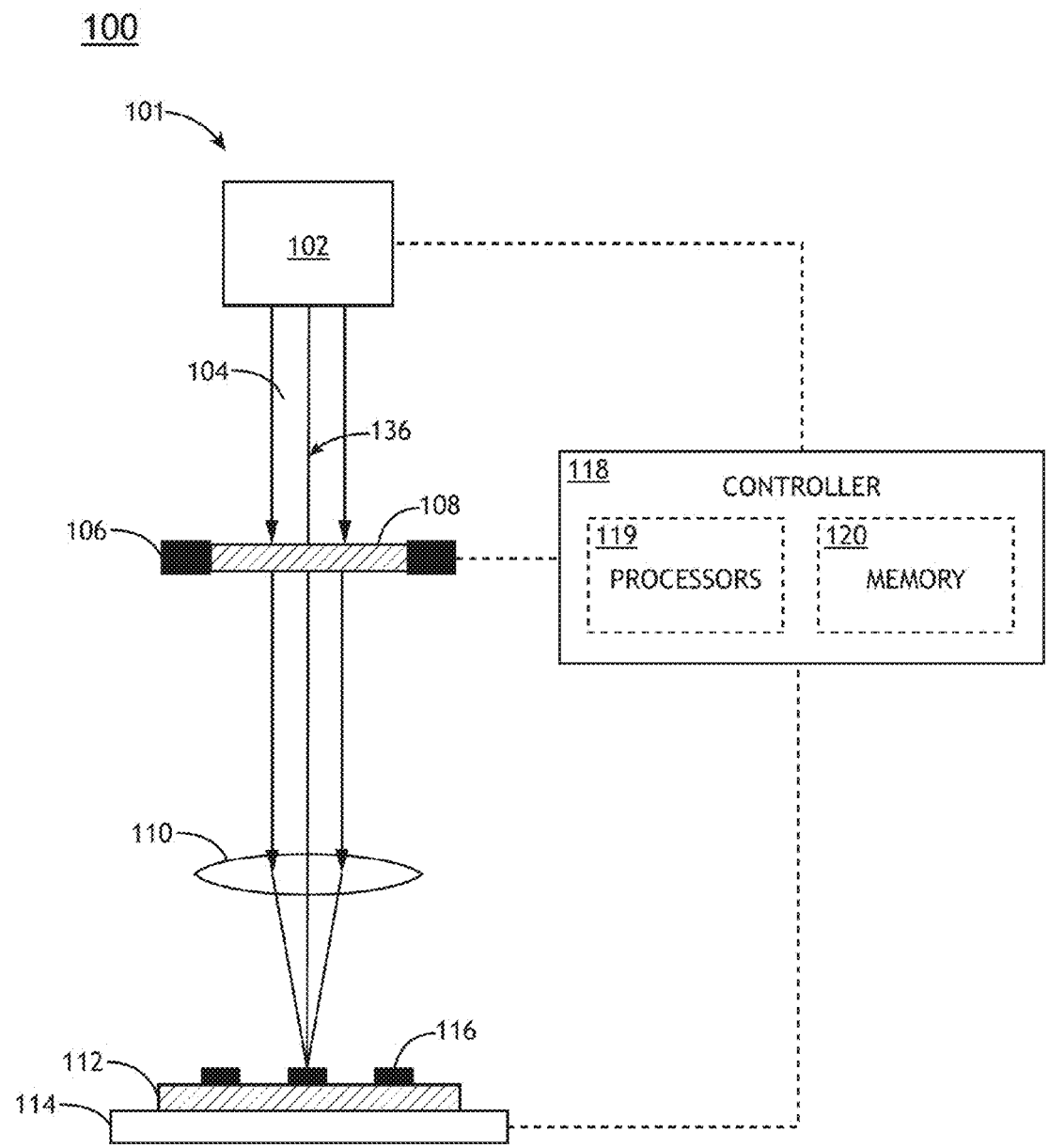
FIG. 1A is a conceptual view illustrating a system including a lithography sub-system for lithographically printing one or more patterns to a sample, in accordance with one or more embodiments of the present disclosure.

Reference will now be made in detail to the subject matter disclosed, which is illustrated in the accompanying drawings.

Referring generally to FIGS. 1A through 9, systems and methods for providing metrology targets sensitive to the position of a sample within the focal volume of a lithography system are disclosed. It is noted herein that it is desirable to accurately monitor and control the position of a sample along the optical axis of a lithography system, which may be referred to as the focal position of the sample. Embodiments of the present disclosure are directed to metrology pattern masks that, when imaged onto a sample by a lithography system, provide a metrology target with characteristics that depend on the focal position of a sample within the lithography system. Additional embodiments of the present disclosure are directed to metrology pattern masks that provide metrology target patterns in which deviations of the focal position of a sample from a nominal focal position correspond to translations of pattern elements within the plane of the metrology target. Further embodiments of the present disclosure are directed to measuring translations of pattern elements of a metrology target using an overlay metrology tool and further mapping the measured translations of pattern elements to deviations of the focal position of a sample from a nominal focal position.

It is recognized herein that in the context of lithographic printing the "best focus" or "iso focus" may be chosen such that the dependence of one or more characteristics of a printed device pattern on changes in the focal position of the lithographic printing tool (e.g., scanner, stepper and the like) is minimal about the focus position. In contrast, a focus-sensitive metrology pattern mask provides a metrology target on the sample that exhibits high sensitivity to changes in the focal position of the sample during one or more lithography steps.

Further, the image of a pattern mask generated on a sample (e.g. by a lithography tool) may critically depend on the proximity of features within the metrology pattern. In this regard, closely spaced features on a metrology pattern mask may influence a pattern printed on a resist layer of a sample based on optical effects such as scattering, diffraction, and the like. Embodiments of the present disclosure are directed to focus-sensitive pattern masks utilizing closely spaced features (e.g. optical proximity correction (OPC) features) such that one or more characteristics of the printed pattern (e.g. the position of the printed pattern on the sample, the size of one or more printed pattern features, a sidewall angle of one or more printed pattern features, or the like) depends on the focal position of the sample during the lithography step.

In this regard, one or more characteristics of a focus-sensitive metrology target (e.g. a translation between two or more pattern elements) may be characterized by a metrology tool (e.g. by a metrology tool typically used for overlay measurements, or the like). Process-sensitive lithographic features are generally described in U.S. Pat. No. 6,673,638, issued on Jan. 6, 2004, which is incorporated by reference in the entirety. Focus masking structures are generally described in U.S. Pat. No. 6,884,552, issued on Apr. 26, 2005, which is incorporated by reference in the entirety. Determining lithographic focus and exposure is generally described in U.S. Pat. No. 7,382,447, issued on Jun. 3, 2008, which is incorporated by reference in the entirety. Process optimization and control using scatterometry signals is generally described in U.S. Pat. No. 7,352,453, issued on Apr. 1, 2008, which is incorporated by reference in the entirety. Detecting overlay errors using scatterometry is generally described in U.S. Pat. No. 7,564,557, issued on Jul. 21, 2009, which is incorporated by reference in the entirety.

It is further recognized that focus-sensitive binary pattern masks in which light from an illumination source is either fully blocked or fully transmitted/reflected to generate an image may be relatively inexpensive to fabricate and may be readily incorporated into many lithography systems.

As used throughout the present disclosure, the term "sample" generally refers to a substrate formed of a semiconductor or non-semiconductor material (e.g. a wafer, or the like). For example, a semiconductor or non-semiconductor material may include, but is not limited to, monocrystalline silicon, gallium arsenide, and indium phosphide. A sample may include one or more layers. For example, such layers may include, but are not limited to, a resist, a dielectric material, a conductive material, and a semiconductive material. Many different types of such layers are known in the art, and the term sample as used herein is intended to encompass a sample on which all types of such layers may be formed. One or more layers formed on a sample may be patterned or unpatterned. For example, a sample may include a plurality of dies, each having repeatable patterned features. Formation and processing of such layers of material may ultimately result in completed devices. Many different types of devices may be formed on a sample, and the term sample as used herein is intended to encompass a sample on which any type of device known in the art is being fabricated. Further, for the purposes of the present disclosure, the term sample and wafer should be interpreted as interchangeable. In addition, for the purposes of the present disclosure, the terms patterning device, mask and reticle should be interpreted as interchangeable.

FIG. 1A is a conceptual view illustrating a system 100 including a lithography sub-system 101 for lithographically printing one or more patterns to a sample, in accordance with one or more embodiments of the present disclosure. In one embodiment, the system 100 consists of a lithographic sub-system 101. The lithographic sub-system 101 may include any lithographic printing tool known in the art. For example, the lithographic sub-system 101 may include, but is not limited to, a scanner or stepper.

In another embodiment, the lithography sub-system 101 may include an illumination source 102 configured to generate an illumination beam 104. The illumination beam 104 may include one or more selected wavelengths of light including, but not limited to, ultraviolet (UV) radiation, visible radiation, or infrared (IR) radiation. In another embodiment, the wavelengths of radiation of the illumination beam 104 emitted by the illumination source 102 are tunable. In this regard, the wavelengths of radiation of the illumination beam 104 may be adjusted to any selected wavelength of radiation (e.g. UV radiation, visible radiation, infrared radiation, or the like). Further, the illumination beam 104 may include one or more beams of illumination. In another embodiment, the illumination source 102 may generate one or more illumination beams 104 having any pattern known in the art. For example, the illumination source 102 may include, but is not limited to, a single-pole illumination source, a dipole illumination source, a C-Quad illumination source, a Quasar illumination source, or a free-form illumination source.

In another embodiment, the lithography sub-system 101 includes a mask support device 106. The mask support device 106 is configured to secure a pattern mask 108. In this regard, the support device 106 may hold the pattern mask 108 utilizing any means known in the art, such as, but not limited to, a mechanical, vacuum, electrostatic or other clamping technique. In another embodiment, the lithography sub-system 101 includes a set of projection optics 110 configured to project an image of the pattern mask 108 illuminated by illumination beam 104 onto the surface of a sample 112 disposed on a sample stage 114. For example, the set of projection optics 110 may be configured to project an image of the pattern mask 108 onto a resist layer 116 on the sample 112 to generate (e.g. expose, or the like) a pattern element (e.g. a metrology pattern) on the resist layer 116 corresponding to the pattern mask 108. Further, the sample stage 114 may control a position of the sample 112 along an optical axis 136 of lithography sub-system 101 (e.g. the focal position of the sample). In another embodiment, the support device 106 may be configured to actuate or position the pattern mask 108. For example, the support device 106 may actuate the pattern mask 108 to a selected position with respect to the projection optics 110 of the system 100.

In another embodiment, the lithography sub-system 101 includes a controller 118 to control the various sub-systems of the lithography sub-system 101. In another embodiment, the controller 118 includes one or more processors 119 configured to execute program instructions maintained on a memory medium 120. In this regard, the one or more processors 119 of controller 118 may execute any of the various process steps described throughout the present disclosure. Further, the controller 118 may be communicatively coupled to the mask support device 106 and/or the sample stage 114 to direct the transfer of pattern elements on a pattern mask 108 to a sample 112 (e.g. a resist layer 116 on the sample, or the like). It is noted herein that the lithography sub-system 101 of the present invention may implement any of the pattern mask designs described throughout the present disclosure. Mask-based lithography by Lee et al. is generally described in U.S. Pat. No. 7,545,520, issued on Jun. 9, 2009, which is incorporated herein in the entirety.

Figure 1B:
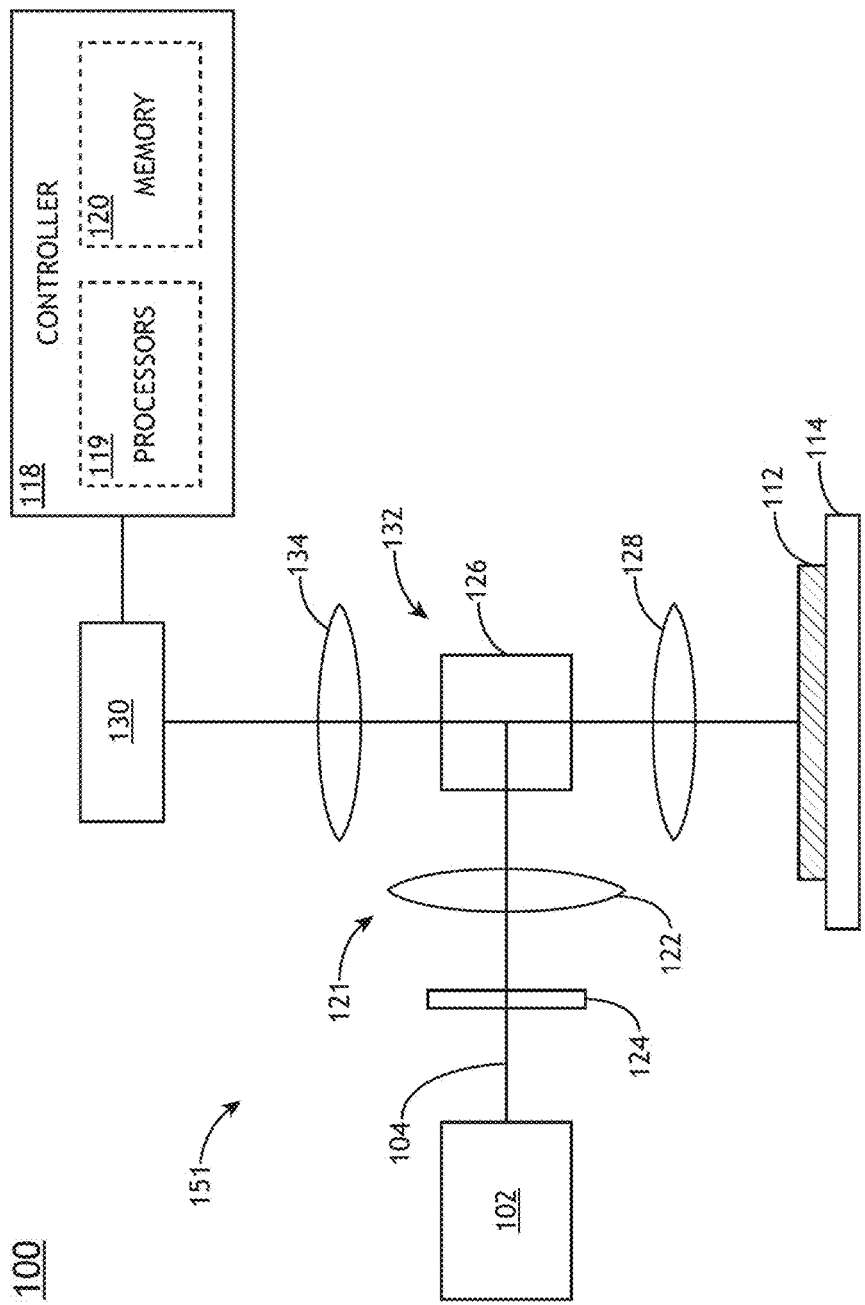
FIG. 1B is a conceptual view illustrating a metrology sub-system, in accordance with one or more embodiments of the present disclosure.

FIG. 1B is a conceptual view illustrating a metrology sub-system 151, in accordance with one or more embodiments of the present disclosure. The metrology sub-system 151 may measure any metrology metric (e.g. overlay error, CD, or the like) using any method known in the art. In one embodiment, the metrology sub-system 151 includes an image-based metrology tool to measure metrology data based on the generation of one or more images of the sample 112. In another embodiment, the metrology sub-system 151 includes a scatterometry-based metrology system to measure metrology data based on the scattering (reflection, diffraction, diffuse scattering, or the like) of light from the sample.

In another embodiment, the illumination source 102 directs the illumination beam 104 to the sample 112 via an illumination pathway 121. The illumination pathway 121 may include one or more lenses 122. Further, the illumination pathway 121 may include one or more additional optical components 124 suitable for modifying and/or conditioning the illumination beam 104. For example, the one or more optical components 124 may include, but are not limited to, one or more polarizers, one or more filters, one or more beam splitters, one or more diffusers, one or more homogenizers, one or more apodizers, or one or more beam shapers. In one embodiment, the illumination pathway 121 includes a beamsplitter 126. In another embodiment, the metrology sub-system 151 includes an objective lens 128 to focus the illumination beam 104 onto the sample 112.

The illumination source 102 may direct the illumination beam 104 to the sample at any angle via the illumination pathway 121. In one embodiment, the illumination source 102 directs the illumination beam 104 to the sample 112 at normal incidence angle to a surface of the sample 112. In another embodiment, the illumination source 102 directs the illumination beam 104 to the sample 112 at an angle (e.g. a glancing angle, a 45-degree angle, and the like).

In another embodiment, the metrology sub-system 151 includes one or more detectors 130 configured to capture radiation emanating from the sample 112 through a collection pathway 132. The collection pathway 132 may include multiple optical elements to direct and/or modify illumination collected by the objective lens 128 including, but not limited to one or more lenses 134, one or more filters, one or more polarizers, one or more beam blocks, or one or more beamsplitters.

For example, a detector 130 may receive an image of the sample 112 provided by elements in the collection pathway 132 (e.g. the objective lens 128, the one or more optical elements, 134, or the like). By way of another example, a detector 130 may receive radiation reflected or scattered (e.g. via specular reflection, diffuse reflection, and the like) from the sample 112. By way of another example, a detector 130 may receive radiation generated by the sample 112 (e.g. luminescence associated with absorption of the illumination beam 104, and the like). By way of another example, a detector 130 may receive one or more diffracted orders of radiation from the sample 112 (e.g. 0-order diffraction, ±1 order diffraction, ±2 order diffraction, and the like). Further, it is noted herein that the one or more detectors 130 may include any optical detector known in the art suitable for measuring illumination received from the sample 112. For example, a detector 130 may include, but is not limited to, a CCD detector, a TDI detector, a photomultiplier tube (PMT), an avalanche photodiode (APD), or the like. In another embodiment, a detector 130 may include a spectroscopic detector suitable for identifying wavelengths of radiation emanating from the sample 112. Further, the metrology sub-system 151 may include multiple detectors 130 (e.g. associated with multiple beam paths generated by one or more beamsplitters to facilitate multiple metrology measurements (e.g. multiple metrology tools) by the metrology sub-system 1511.

In another embodiment, the metrology sub-system 151 is communicatively coupled to the controller 118 of system 100. In this regard, the controller 118 may be configured to receive metrology data including, but not limited to, metrology data (e.g. metrology measurement results, images of the target, pupil images, and the like) or metrology metrics (e.g. precision, tool-induced shift, sensitivity, diffraction efficiency, through-focus slope, side wall angle, critical dimensions, and the like).

Figure 1C:
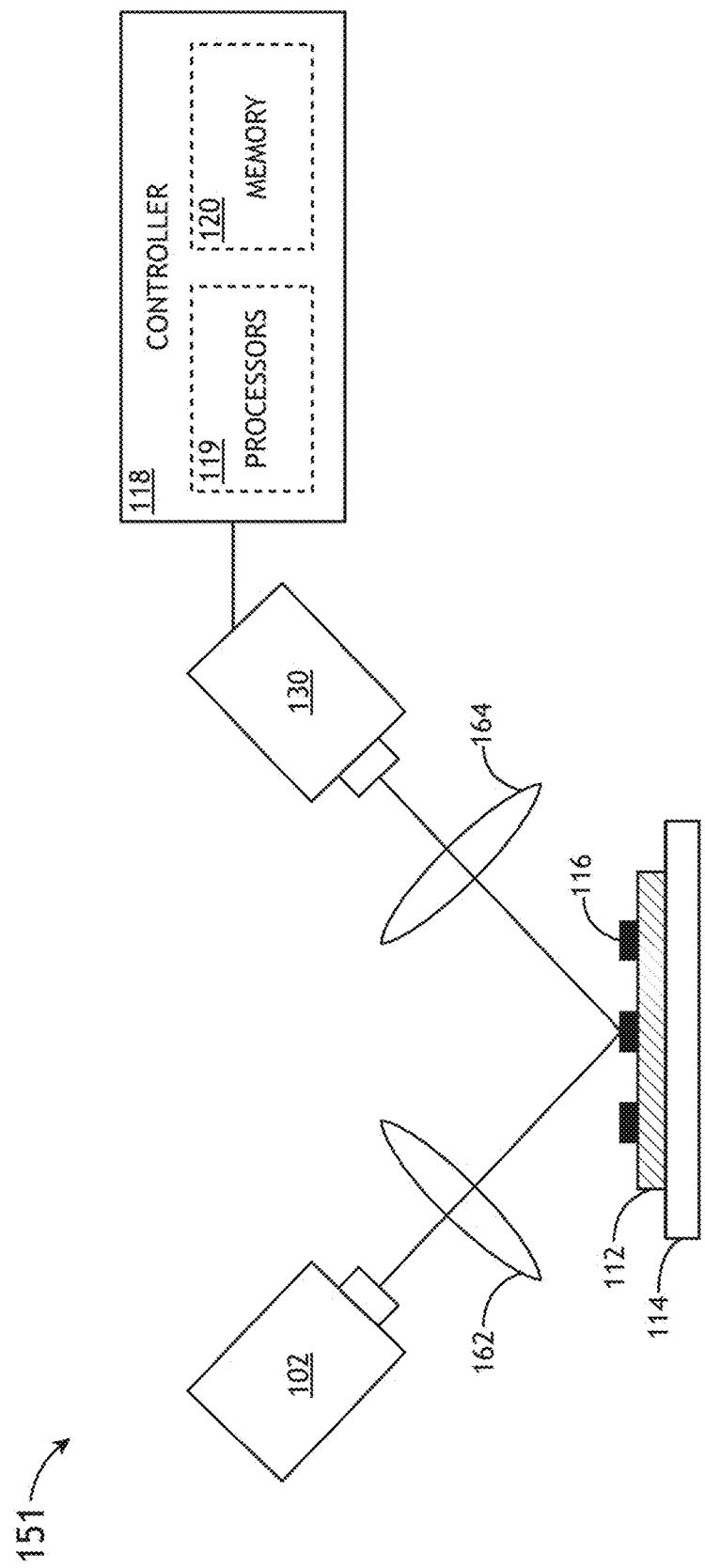
FIG. 1C is a conceptual view illustrating a metrology sub-system, in accordance with one or more embodiments of the present disclosure.

FIG. 1C is a conceptual view illustrating a metrology sub-system 151, in accordance with another embodiment of the present disclosure. In one embodiment, the illumination pathway 121 and the collection pathway 132 contain separate elements. For example, the illumination pathway 121 may utilize a first focusing element 162 to focus the illumination beam 104 onto the sample 112 and the collection pathway 132 may utilize a second focusing element 164 to collect radiation from the sample 112. In this regard, the numerical apertures of the first focusing element 162 and the second focusing element 164 may be different. Further, it is noted herein that the metrology sub-system 151 depicted in FIG. 1C may facilitate multi-angle illumination of the sample 112, and/or more than one illumination source 102 (e.g. coupled to one or more additional detectors 130). In this regard, the metrology sub-system 151 depicted in FIG. 1C may perform multiple metrology measurements. In another embodiment, one or more optical components may be mounted to a rotatable arm (not shown) pivoting around the sample 112 such that the angle of incidence of the illumination beam 104 on the sample 112 may be controlled by the position of the rotatable arm.

FIGS. 2A through 2E are conceptual diagrams of pattern elements on a pattern mask 108, in accordance with one or more embodiments of the present disclosure. In another embodiment, a focus-sensitive pattern mask 108 includes one or more OPC features to influence one or more characteristics of pattern images (e.g. printed images on a resist 116 of a sample 112) based on the focal position of the sample during imaging (e.g. by lithography sub-system 101). Further, OPC features associated with a focus-sensitive pattern mask 108 may include, but are not required to include, one or more sub-resolution elements (e.g. one or more elements with a dimension or a separation distance smaller than a resolution of projection optics 110 of the lithography sub-system 101). It is noted herein that the presence of sub-resolution features (e.g. separation distances 224-230 between segments, or the like) may provide a well-characterized influence on the pattern image of the sample. For example, sub-resolution features may provide scattering sites, induce diffraction, or the like.

FIG. 2A is a block diagram illustrating an unsegmented pattern element 202 including a single segment 210. In this regard, pattern element 202 is symmetric and does not include OPC features. FIGS. 2B through 2D illustrate segmented pattern elements 204-208. In one embodiment, as shown in FIGS. 2B through 2D, a segmented pattern element includes two or more additional segments arranged such that all of the segments are distributed along a particular direction. Further, a segmented pattern element may, but is not required to, include a primary segment and two or more additional segments (e.g. OPC features such as scattering bars, or the like) having widths along the particular direction smaller than the primary element. FIG. 2B is a block diagram illustrating a symmetric segmented pattern element 204 including a first segment 212 adjacent to two additional segments 214 (e.g. scattering bars). FIG. 2C is a block diagram illustrating a left-asymmetric pattern element 206 including a first segment 216 and an additional segment 218 (e.g. a scattering bar) to the left of the first element (e.g. proximate to a first side of the first segment 216). FIG. 2D is a block diagram illustrating a right-asymmetric pattern element 208 including a first segment 220 and an additional segment 222 (e.g. a scattering bar) to the right of the first element (e.g. proximate to a second side opposite the first side of the first segment 220). It is noted herein that a left-asymmetric segmented pattern element may be, but is not required to be, a rotational translation of a right-asymmetric pattern element such that left-asymmetry and right-asymmetry are defined according to a particular orientation (e.g. a reference orientation). However, it is noted herein that lithography sub-system 101 may be configured such that a direction of asymmetry (e.g. a left-asymmetry, a right-asymmetry, or the like) may influence one or more characteristics of the corresponding printed pattern on the sample 112. For example, the lithography sub-system may be configured to provide asymmetric aerial imaging (e.g. through an off-axis illumination source, or the like) such that a printed pattern corresponding to a left-asymmetric pattern element of the pattern mask 108 exhibits one or more characteristics distinguishable from a printed pattern corresponding to a right-asymmetric pattern element of the pattern mask 108.

In another embodiment, the separation distance between segments of a focus-sensitive segmented pattern element (e.g. separation distances 224-230 of pattern elements 204-208, or the like) is smaller than an optical resolution of a set of projection optics 110 of the lithography sub-system 101. In this regard, the individual segments (alternately, the separations between the segments) may not be fully resolved in the image of the segmented pattern elements (e.g. the pattern image) generated by the projection optics 110 on the resist 116 of the sample 112. Accordingly, separations between segmented pattern elements 204-208 may appear "blurry" or as a single unsegmented element on the pattern image. Further, segments of pattern elements separated by sub-resolution distances (e.g. scattering bars, or the like) may operate as optical proximity correction (OPC) features to influence the pattern image of the unsegmented pattern element.

In another embodiment, as shown in FIG. 2E, a composite segmented pattern element may include a periodic distribution of segments. For example, segmented pattern element 232 includes five instances of asymmetric pattern elements separated by a first distance 240. Further, each asymmetric pattern element includes a primary segment 236 and an additional segment 234 (e.g., a scattering bar) separated from the primary segment 236 by a second distance 238. In another embodiment, the widths of all segments (e.g., the lengths along the direction along which the segments are separated) are sub-resolution features such the pattern image of the entire composite segmented pattern element 232 imaged by the projection optics 110 includes a single feature (e.g., the individual segments 234, 236 are not individually resolved).

In another embodiment, asymmetric pattern elements (e.g. asymmetric pattern elements 206-208, composite asymmetric pattern element 232, or the like) with asymmetric features such as, but not limited to, scattering bars asymmetrically distributed around a primary segment, operate as focus-sensitive pattern elements. For example, one or more characteristics of a pattern image of an asymmetric pattern element (e.g. a position of the pattern image on the sample, a size of the pattern image on the sample, or the like) is dependent on the focal position of the sample during imaging (e.g. by the lithography sub-system 101). In this regard, measurement of the one or more focus-dependent characteristics (e.g. by metrology sub-system 151, or the like) may provide data on the focal position of the sample during the printing of pattern elements by the lithography sub-system 101.

The pattern mask 108 may be a binary reflective or a transmissive element (e.g. a binary pattern mask, or the like). In one embodiment, the pattern mask 108 is a transmissive element in which segments 208 block the transmission of an illumination beam 104 (e.g. through absorption or reflection of the illumination beam 104). Accordingly, the illumination beam 104 may be transmitted through spaces between segments 208 to the set of projection optics 110. In another embodiment, the pattern mask 108 is a reflective element in which segments 208 reflect an illumination beam 104 to the set of projection optics 110 and the spaces between segments 208 absorb or transmit the illumination beam 104. Further, the segments 208 of the pattern mask 108 may be formed from any opaque or semi-opaque material known in the art for reflecting and/or absorbing an illumination beam 104. In another embodiment, the segments 208 may include a metal. For example, the segments 208 may be, but are not required to be, formed from chrome (e.g. a chrome alloy, or the like).

The pattern mask 108 may be utilized (e.g. by lithography sub-system 101) in any imaging configuration known in the art. For example, the pattern mask 108 may be a positive mask in which segments 208 are positively imaged as patterned elements of a resist layer 116 of sample 112. By way of another example, the pattern mask 108 may be a negative mask in which segments 208 form negative pattern elements (e.g. gaps, spaces, or the like) of a resist layer 116 of sample 112.

It is further noted that the pattern elements illustrated in FIGS. 2A through 2D and the corresponding descriptions are provided solely for illustrative purposes and should not be interpreted as limiting. For example, a pattern element may include any number of segments distributed along any direction.

Figure 3:
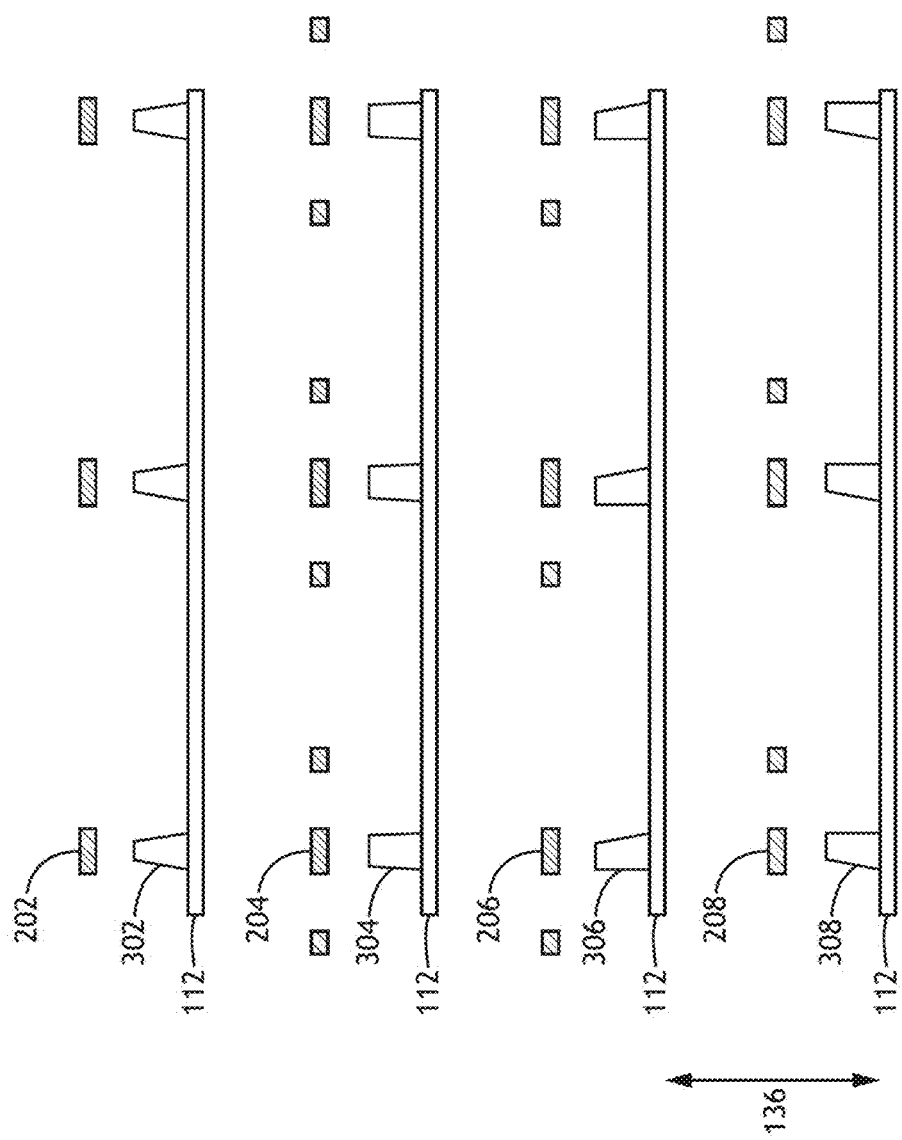
FIG. 3 is a block diagram illustrating exemplary profiles of resist layer along the optical axis of a lithography sub-system associated with printed images corresponding to pattern elements, in accordance with one or more embodiments of the present disclosure.

FIG. 3 is a block diagram illustrating exemplary profiles of resist layer 116 along the optical axis 136 of lithography sub-system 101, in accordance with one or more embodiments of the present disclosure. The exemplary profiles of resist layer 116 are associated with printed elements corresponding to images of pattern elements 202-208 in which the resist layer 116 is located at a nominal focal position along optical axis 136. In one embodiment, printed elements 302 associated with images of unsegmented pattern element 202 exhibit a symmetric profile with respect to optical axis 136. In another embodiment, printed elements 304 associated with images of pattern element 204 including symmetric scattering bars also exhibits a symmetric profile. In this regard, pattern elements 202 and 204 may be considered as focus-insensitive pattern elements. However, the scattering bars, though not imaged onto the resist 116, influence (via optical proximity of the segments) the sidewall angle of the printed elements 304 (e.g. the sidewall angles of printed elements 304 are steeper than the sidewall angles of printed patterns 302 as illustrated in FIG. 3). In another embodiment, printed elements 306 associated with pattern element 206 including a left-asymmetric scattering bar exhibit an asymmetric profile. For example, the left sidewall angles of the printed elements 306 are influenced by the scattering bar and are correspondingly steeper than the right sidewall angles. In another embodiment, printed elements 306 associated with pattern element 208 including a right-asymmetric scattering bar exhibit an asymmetric profile. For example, the right sidewall angles of the printed elements 308 are influenced by the scattering bar and are correspondingly steeper than the left sidewall angles. In this regard, asymmetric scattering bars may operate as OPC elements to induce an asymmetry in the printed pattern with respect to the optical axis 136. Accordingly, one or more characteristics of the pattern elements such as, but not limited to, a critical dimension (CD), sidewall angles, or a center location of pattern elements may be measured (e.g. by metrology sub-system 151) and used to calculate the focal position of the sample 112 during imaging.

Figure 4A:
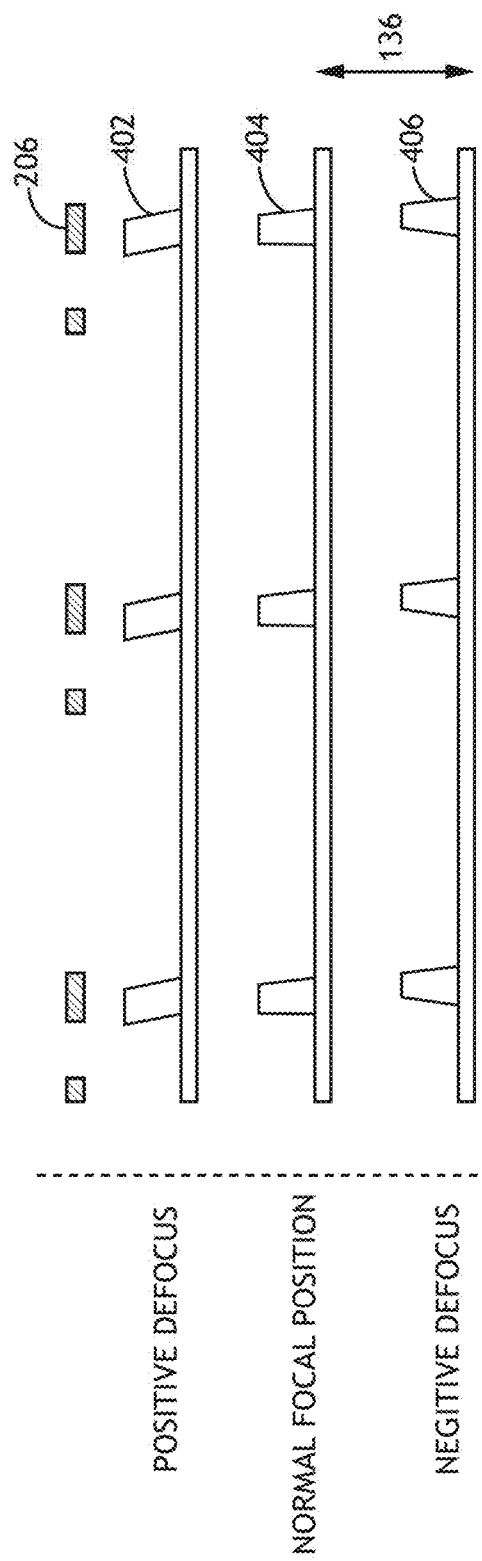
FIG. 4A is a block diagram illustrating exemplary profiles of resist layer 116 for multiple locations of sample along the optical axis of a lithography sub-system associated with printed images corresponding to left-asymmetric pattern elements, in accordance with one or more embodiments of the present disclosure.
Figure 4B:
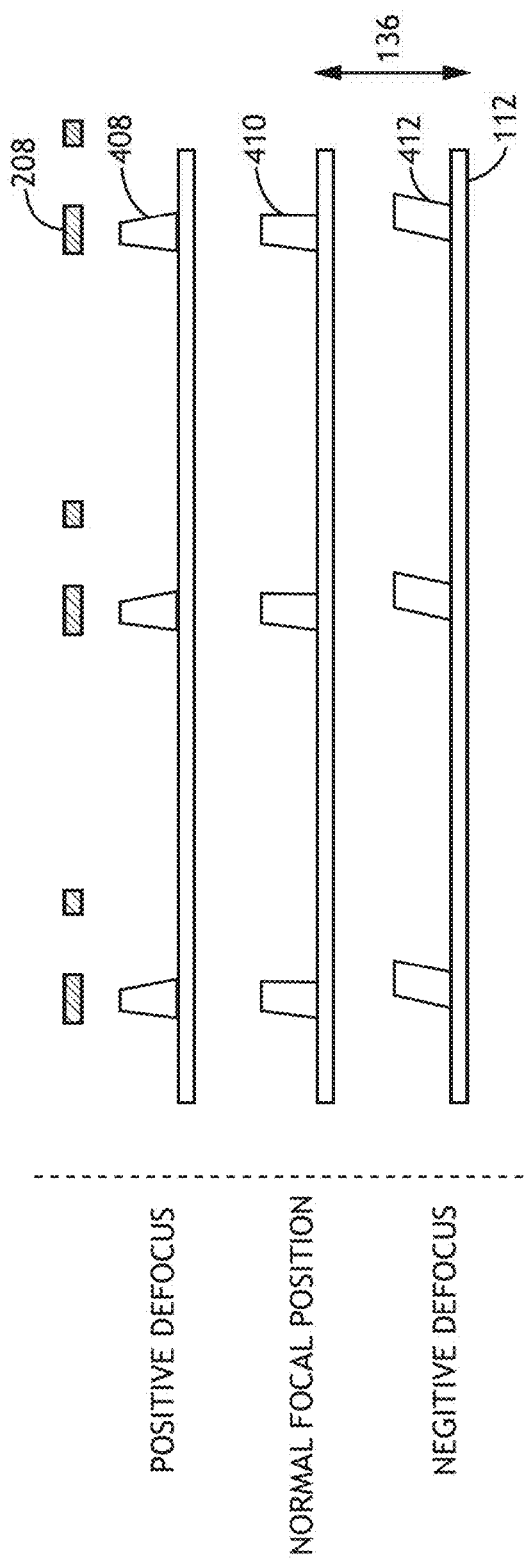
FIG. 4B is a block diagram illustrating exemplary profiles of resist layer for multiple locations of sample along the optical axis of a lithography sub-system associated with printed images corresponding to right-asymmetric pattern elements, in accordance with one or more embodiments of the present disclosure.

FIGS. 4A and 4B are block diagrams illustrating exemplary profiles of resist layer 116 for multiple locations of sample 112 along optical axis 136. The exemplary profiles of resist layer 116 are associated with printed patterns corresponding to images of asymmetric pattern elements 206-208, in accordance with one or more embodiments of the present disclosure. In one embodiment, one or more characteristics of the printed patterns vary depending on the focal position of the sample. For example, the left sidewall angle associated with printed elements 402-406 strongly varies as a function of focal position of the sample 112 due to the left-asymmetry of the pattern element 206, whereas the right sidewall angle is influenced to a lesser degree by the focal position of the sample. Similarly, the right sidewall angle associated with printed elements 408-412 strongly varies as a function of focal position of the sample 112 due to the right-asymmetry of the pattern element 208, whereas the left sidewall angle is influenced to a lesser degree by the focal position of the sample. In another embodiment, as shown in FIGS. 4A and 4B, printed elements 402-406 associated with left-asymmetric pattern elements 206 are further distinguishable from printed elements 408-412 associated with right-asymmetric pattern elements 208. In another embodiment (not shown), printed elements 402-406 associated with left-asymmetric pattern elements 206 and right-asymmetric pattern elements 208 provide similar, rotationally translated, modifications of resist profiles as a function of focal position of the sample 112.

In another embodiment, a pattern mask includes a characteristic design of an overlay metrology target such that a deviation of the focal position of the sample is manifested as a measurable translation of one or more pattern elements. For example, a typical imaging metrology overlay target (e.g. an Advanced Imaging Metrology (AIM) target, a box-in box, target, or the like) may include one or more pattern elements associated with one or more processing steps such that an overlay error (e.g. a translation of one layer with respect to another) is manifested as a relative translation between pattern elements of the imaging metrology overlay target. Correspondingly, a focus-sensitive metrology target may be designed to mimic an imaging metrology overlay target such that a deviation of the focal position of the sample is manifested as a measurable translation of one or more pattern elements of the focus-sensitive metrology target. It is noted herein that a focus-sensitive mask may be designed to mimic any overlay metrology target including, but not limited to, imaging metrology overlay targets or scatterometry metrology overlay targets. It is further noted that a focus-sensitive metrology target that mimics an overlay metrology target may be readily characterized by a commercial overlay metrology tool. Further, the output of the commercial overlay metrology tool may be further analyzed (e.g. by controller 118) to convert a measured "overlay error" to the focal position of the sample when the pattern mask was imaged. For example, the focus-sensitive metrology target may be designed such that no measured overlay error corresponds to a sample positioned at a nominal (or desired) focal position. In this regard, a measured overlay error by an overlay metrology tool may correspond to an error (e.g. an offset) in the focal position of the sample relative to the nominal position.

In another embodiment, a focus-sensitive pattern mask with asymmetric pattern elements may be used to generate a corresponding printed metrology target (e.g. including printed elements associated with an image of the focus-sensitive pattern mask) for any number of process layers on a target. For example, a focus-sensitive mask may be used to generate a metrology target suitable for characterizing the focal position of the sample for the single layer. By way of another example, a focus-sensitive mask may be used to generate a metrology target suitable for characterizing the focal position of the sample for any number of process layers. In this regard, a focus-sensitive pattern mask may be used to generate printed patterns in one or more layers of a metrology target, and a focus-insensitive pattern mask (e.g. a pattern mask with symmetric elements, or the like) may be used to generate printed patterns in one or more additional layers of the metrology target. In another embodiment, a single metrology target includes pattern elements associated with both focus-sensitive and focus-insensitive pattern masks. Accordingly, printed pattern elements associated with focus-insensitive pattern masks may serve as points of reference for the measurement of relative position of printed pattern elements associated with focus-sensitive pattern masks. Further, a metrology target including printed pattern elements associated with both focus-sensitive and focus-insensitive pattern masks may simultaneously provide traditional overlay data (e.g. translations between one or more process layers on the sample) and the focal position of the sample for one or more process layers.

Figure 5:
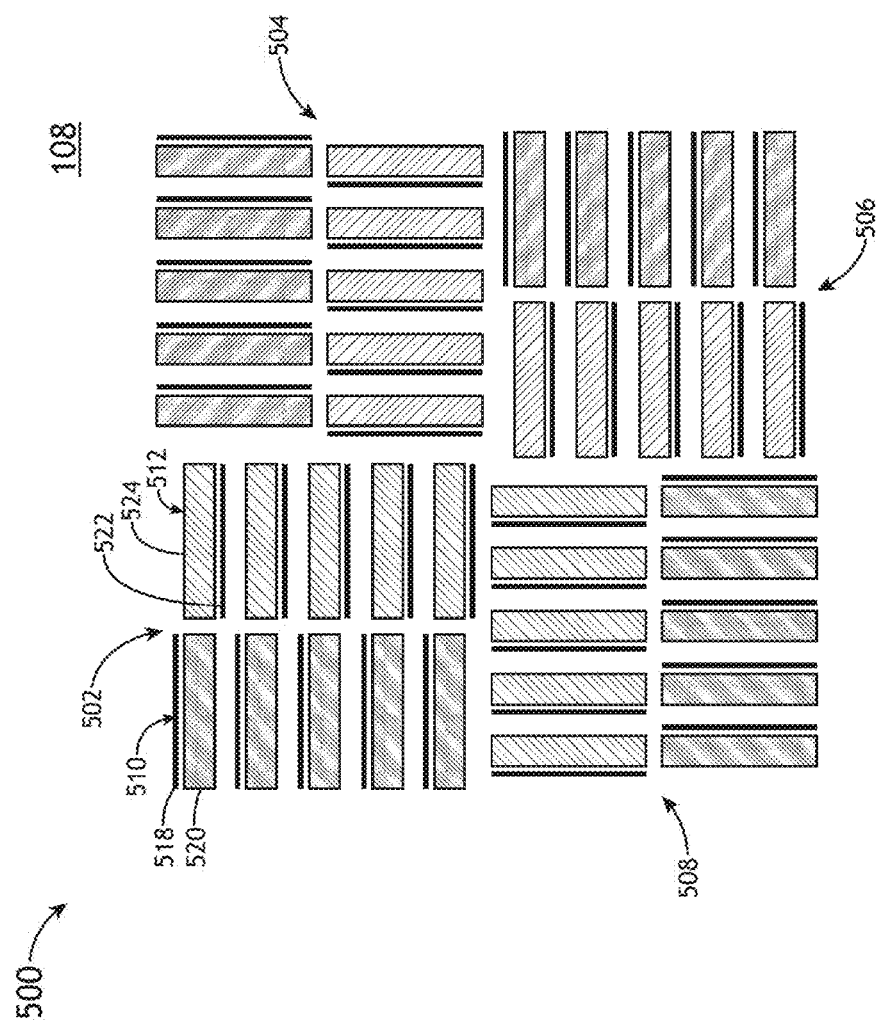
FIG. 5 is a block diagram illustrating a focus-sensitive pattern mask, in accordance with one or more embodiments of the present disclosure.

FIG. 5 is a block diagram illustrating a focus-sensitive pattern mask 500, in accordance with one or more embodiments of the present disclosure. Focus-sensitive pattern mask 500 may be characteristic of a two-layer AIM metrology overlay target. In one embodiment, pattern mask 500 includes one or more cells 502-508. Further, each cell 502-508 includes at least one asymmetric pattern element with one or more characteristics dependent on the focal position of the sample onto which the pattern mask 500 is imaged. For example, as shown in FIGS. 3 through 4B, a detectable position of the pattern images (e.g. a pattern placement error (PPE)) may vary as a function of the focal location of the sample 112. In another embodiment, a first cell 502 includes two sets of asymmetric pattern elements 510,512 having asymmetries in opposite directions. For example, pattern elements 510 include scattering bars 518 on a first side of primary segments 520 (e.g. a "top side" according to the orientation of FIG. 5), whereas pattern elements 512 include scattering bars 522 on a second side opposite the first side of primary segments 524 (e.g. a "bottom side" according to the orientation of FIG. 5). In this regard, deviations of the focal location of the sample onto which the pattern mask 500 is imaged may result in translations of the printed patterns corresponding to pattern elements 510 and pattern elements 512 in opposite directions. Accordingly, the misalignment of printed patterns corresponding to pattern elements 510 and pattern elements 512 may be measurable via a metrology tool (e.g. metrology sub-system 151) and the focal position of the sample may be determined (e.g. by controller 118).

In another embodiment, cell 504 of pattern mask 500 is a rotated instance (e.g. an orthogonally rotated version) of cell 502. In this regard, pattern mask 500 is sensitive to variations of the focal position of the sample along two dimensions (e.g. to measure pitch and yaw of the sample, or the like). Further, cells 506 and 508 may be repeated instances of cells 502 and 504, respectively.

Figure 6:
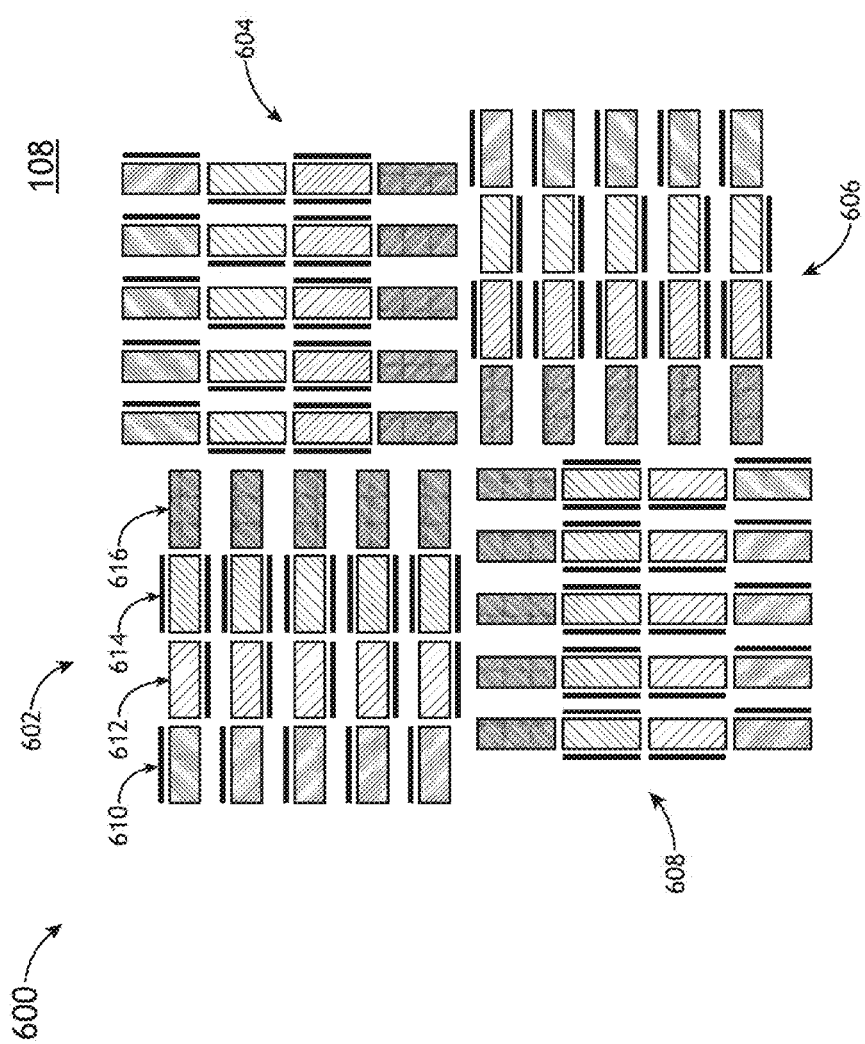
FIG. 6 is a block diagram illustrating a focus-sensitive pattern mask including four different sets of pattern elements, in accordance with one or more embodiments of the present disclosure.

FIG. 6 is a block diagram illustrating a focus-sensitive pattern mask 600 including four different sets of pattern elements, in accordance with one or more embodiments of the present disclosure. Focus-sensitive pattern mask 600 may be characteristic of a four-layer AIM overlay metrology target. In one embodiment, each cell 602-608 includes two sets of asymmetric pattern elements 610 and 612 having asymmetries in opposite directions. Accordingly, deviations of the sample onto which pattern mask 600 is imaged may result in translations of the printed elements corresponding to pattern elements 610 and pattern elements 612 in opposite directions. In another embodiment, focus-sensitive pattern mask 600 includes a set of pattern elements 614 with symmetric scattering bars and a set of pattern elements 616 without scattering bars (e.g. a set of unsegmented pattern elements). Accordingly, characteristics of printed elements corresponding to pattern elements 614 and 616 may not depend on the focal location of the sample. In this regard, a metrology tool (e.g. metrology sub-system 151) may monitor relative translations between asymmetric printed pattern elements (e.g. associated with pattern elements 610, 612) and symmetric printed pattern elements (e.g. associated with 614,616) to further determine the focal location of the sample. It is noted herein that multiple different sets of pattern elements (e.g. asymmetric segmented pattern elements, symmetric segmented pattern elements, symmetric unsegmented pattern elements, or the like) on a focus-sensitive pattern mask may facilitate the measurement of multiple characteristics of the corresponding printed patterns such as, but not limited to sidewall angles or relative positions of printed elements.

In another embodiment, cell 604 of pattern mask 600 is a rotated instance (e.g. an orthogonally rotated version) of cell 602. In this regard, pattern mask 600 is sensitive to variations of the focal position of the sample in dimensions (e.g. to measure pitch and yaw of the sample, or the like). Further, cells 606 and 608 may be repeated instances of cells 602 and 604, respectively.

Figure 7:
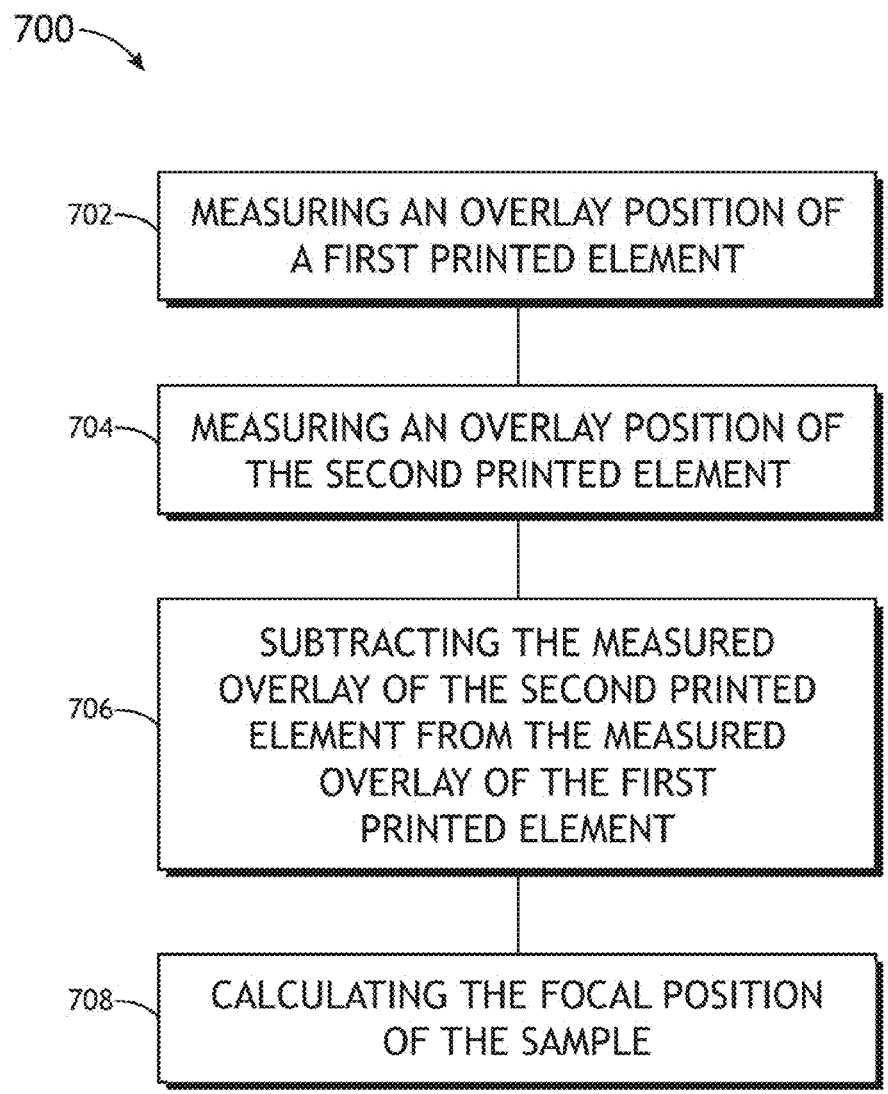
FIG. 7 is a flow diagram illustrating a method for determining a focal position of a sample 112 based on measured positions of printed images, in accordance with one or more embodiments of the present disclosure.

FIG. 7 is a flow diagram illustrating a method for determining a focal position of a sample 112 based on measured positions of printed images (e.g. printed elements) in a resist 116 of sample 112 associated with pattern elements of a focus-sensitive pattern mask, in accordance with one or more embodiments of the present disclosure. For example, measured positions of printed elements may be measured as overlay positions by an overlay metrology tool (e.g. metrology sub-system 151). In one embodiment, step 702 includes measuring an overlay position of a first printed element. For example, the overlay position of a first printed element may be described as:

$$OL_1(X,Y) = (X_{01}, Y_{01}) + OL(X,Y) + (b \cdot F_X, c \cdot F_Y)$$

where $X_{01}$ and $Y_{01}$ represent offsets associated with the first printed element due to the presence of asymmetric segments (e.g. scattering bars, or the like), OL is the true overlay error, $F_X$ and $F_Y$ correspond to the focal position errors (e.g. deviations of a sample focal position from a nominal focal position) as measured in the X and Y directions, and b and c represent scaling factors (e.g. corresponding to a sensitivity of a measured overlay as a function of deviation of the focal position of the sample, or the like).

In another embodiment, step 704 includes measuring an overlay position of the second printed element. For example, the overlay position of the second printed element may be described as:

$$OL_2(X,Y) = (X_{02}, Y_{02}) + OL(X,Y) + (-b \cdot F_X, -c \cdot F_Y)$$

where $X_{02}$ and $Y_{02}$ represent offsets associated with the second printed element due to the presence of asymmetric segments (e.g. scatter bars, or the like).

In another embodiment, step 706 includes subtracting the measured overlay of the second printed element from the measured overlay of the first printed element. For example:

$$OL_1 - OL_2 = (X_{01} - X_{02}, Y_{01} - Y_{02})(2b \cdot F_X, 2c \cdot F_Y).$$

In another embodiment, step 708 includes calculating the focal position of the sample. For example, the focal position of the sample as measured in the X and Y directions may be calculated as:

$$F_X = \frac{(OL_1(X) - OL_2(X)) - (X_{01} - X_{02})}{2b}$$

$$F_Y = \frac{(OL_1(Y) - OL_2(Y)) - (Y_{01} - Y_{02})}{2c}$$

Further, the total overlay may be calculated as:

$$OL(X, Y) = \frac{(OL_1(X, Y) + OL_2(X, Y)) - ((X_{01}, Y_{01}) + (X_{02}, Y_{02}))}{2}$$

In another embodiment, metrology targets generated by focus-sensitive pattern masks may be fabricated such that the focal position of the sample may be calculated from overlay data collected by a scatterometry overlay metrology tool.

It is recognized herein that metrology targets (e.g. overlay targets, and the like) utilized in scatterometry overlay metrology tools typically include a grating-over-grating structure. For example, a cell of a grating-over-grating scatterometry overlay target may include a series of periodic structures (e.g. a diffraction grating) in one layer of the metrology target stacked above at least a second series of periodic structures in a second layer. In this regard, a cell of the metrology target is formed from at least two stacked diffraction gratings. Additionally, an overlay target may include multiple cells with different predetermined offsets (e.g. lateral translations) between the multiple diffraction gratings. In this regard, an overlay measurement measures an offset that is constant across each of the cells, which may in turn be associated with an alignment error of two layers of a semiconductor process.

It is further recognized herein that, in scatterometry overlay metrology tools, an illumination beam 104 incident on a metrology target on the sample 112 will generate a well-defined diffraction pattern that is detected at least in part by the detector 130 (e.g. a spectrometer) located at an image plane that may provide data associated with the wavelengths of radiation captured by the metrology sub-system 151 (e.g. wavelengths of radiation that enter through the entrance pupil of the metrology sub-system 151). Accordingly, a detector 130 (e.g. a CCD detector) located at a pupil plane of a scatterometry overlay metrology tools provide data associated with the angle at which light enters the system. In this regard, each pixel in the pupil plane measures the reflectivity of the metrology target associated with a different diffraction angle of the illumination beam 104.

Accordingly, an overlay measurement may be performed in a scatterometry overlay metrology tool by generating differential signals between measurements of each of the cells of the overlay target. For example, a scatterometry overlay metrology tool configured to measure zero-order diffraction from the metrology target may require measurements from four cells of the metrology target with different predetermined offsets to determine an overlay offset along a single direction. By way of another example, a scatterometry overlay metrology tool configured to measure first-order diffraction (e.g. +1 and −1 diffracted orders) from the metrology target may require measurements from two cells of the metrology target with different predetermined offsets to determine an overlay offset along a single direction. In this regard, a differential signal may be a pixel-by-pixel subtraction of measurements from each of the two cells of the metrology target. However, it is noted herein that the description of a particular scatterometry overlay metrology tool or particular scatterometry metrology targets is provided solely for illustrative purposes and should not be interpreted as limiting. Focus-sensitive metrology targets suitable for any scatterometry overlay metrology tool or method of capturing and/or analyzing scatterometry data from metrology targets is within the spirit and scope of the present disclosure.

FIGS. 8A through 8D are block diagrams illustrating focus-sensitive pattern masks for scatterometry measurements, in accordance with one or more embodiments of the present disclosure. It is noted herein that metrology targets associated with images of the focus-sensitive pattern masks will typically include pattern elements on two or more layers of material to generate the grating-over-grating structure. Further, different pattern masks (e.g. focus-sensitive pattern masks or focus-insensitive pattern masks) may be used to generate the pattern elements for the two or more layers. In one embodiment, a first layer (e.g. a "bottom layer") of a metrology target is fabricated with a focus-insensitive pattern mask. Accordingly, the positions of pattern elements forming a grating structure on the first layer of the metrology target are be insensitive to the focal position of the sample. Further, a second layer (e.g. a "top layer") of a metrology target is fabricated with a focus-sensitive pattern mask (e.g. as illustrated in FIGS. 8A through 8D). Accordingly, the positions of the pattern elements in the second layer depend on the focal position of the sample. In this regard, deviations of the focal position of the sample may result in translations of the pattern elements in the second layer. Such translations may be measured by a scatterometry overlay metrology tool and be further used to compute (e.g. via controller 118) the focal position of the sample (e.g. during the printing of pattern elements in the second layer of the metrology target).

FIG. 8A illustrates a focus-sensitive pattern mask 800 including cells 802-808. In another embodiment, cell 802 includes a set of asymmetric pattern elements. For example the set of asymmetric pattern elements may include a primary segment 812 and a scattering bar 810 separated from the primary segment 812 in the −X direction (e.g. the "left" direction according to the orientation of FIG. 8A). In another embodiment, cells 804-808 of pattern mask 800 include similarly spaced asymmetric pattern elements oriented in the first direction but with different predetermined translation offsets in the first direction.

FIG. 8B illustrates a focus-sensitive pattern mask 814 including cells 816-822. In another embodiment, cell 816 includes a set of asymmetric pattern elements. For example the set of asymmetric pattern elements may include a primary segment 826 and a scattering bar 824 separated from the primary segment 826 in the −Y direction (e.g. the "down" direction according to the orientation of FIG. 8B). In another embodiment, cells 816-822 of pattern mask 814 include similarly spaced asymmetric pattern elements oriented in the first direction but with different predetermined translation offsets in the first direction.

FIG. 8C illustrates a focus-sensitive pattern mask 828 including cells 830-836. In another embodiment, cell 830 includes a set of asymmetric pattern elements. For example the set of asymmetric pattern elements may include a primary segment 838 and a scattering bar 840 separated from the primary segment 838 in the +X direction (e.g. the "right" direction according to the orientation of FIG. 8C). In another embodiment, cells 830-836 of pattern mask 828 include similarly spaced asymmetric pattern elements oriented in the first direction but with different predetermined translation offsets in the first direction.

FIG. 8D illustrates a focus-sensitive pattern mask 842 including cells 844-850. In another embodiment, cell 844 includes a set of asymmetric pattern elements. For example the set of asymmetric pattern elements may include a primary segment 852 and a scattering bar 854 separated from the primary segment 852 in the +Y direction (e.g. the "top" direction according to the orientation of FIG. 8D). In another embodiment, cells 844-850 of pattern mask 828 include similarly spaced asymmetric pattern elements oriented in the first direction but with different predetermined translation offsets in the first direction.

In another embodiment, scatterometry overlay measurements associated with metrology targets generated using a focus-insensitive pattern mask for a first layer and focus-sensitive pattern masks 800,814,828,842 in a second layer are utilized to determine a focal position of the sample using scatterometry overlay measurements along both the X and Y axes (e.g. to obtain the pitch and yaw of the sample). Specifically, the focal position (e.g. a differential between a real focal position and a nominal focal position) may be proportional to a difference between overlay errors measured using two 8-cell metrology targets. For example, a first 8-cell metrology target may be fabricated using focus-sensitive pattern masks 800 and 814 in a second layer and focus-insensitive pattern masks for a first layer. Similarly, a second 8-cell metrology target may be fabricated using focus-sensitive masks 828 and 842 for the second layer and focus insensitive pattern masks for the first layer. Further, an overlay may be measured as the average of the measured overlay errors from the two 8-cell metrology targets.

In another embodiment, metrology targets generated using a focus-insensitive pattern mask for a first layer and each of focus-sensitive pattern mask 800 and focus-sensitive pattern mask 828 in a second layer are utilized to determine a focal position of the sample using scatterometry overlay measurements along the X axis. In another embodiment, metrology targets generated using a focus-insensitive pattern mask for a first layer and focus-sensitive pattern masks 814, 842 in a second layer are utilized to determine a focal position of the sample using scatterometry overlay measurements along the Y axis.

In another embodiment, the sensitivity of a metrology target generated using a focus-sensitive pattern mask is calibrated using a focus exposure matrix (FEM) in which pattern elements are printed (e.g. by lithography sub-system 101) for a range of focal positions of the sample and for a range of exposed dose of energy incident on the sample by the illumination beam 104. Further, a reference focus metrology target (e.g. a focus metrology target associated with a phase shift focus monitor (PSFM), or the like) may be fabricated along with the FEM. In this regard, one or more characteristics of the metrology target generated using the focus-sensitive pattern mask may be correlated to known sample focal offset values.

FIG. 9 is a flow diagram illustrating steps performed in a method 900 for determining a position of a sample along an optical axis of a lithography system. Applicant notes that the embodiments and enabling technologies described previously herein in the context of system 100 should be interpreted to extend to method 900. It is further noted, however, that the method 900 is not limited to the architecture of system 100. In one embodiment, the method includes a step 902 of generating an image of a lithography mask with a set of projection optics. For example, the mask may include at least one asymmetric segmented pattern element, in which the image of a particular asymmetric segmented pattern element is an unsegmented pattern image. In this regard, a position of the unsegmented pattern image on the sample may be indicative of a location of the sample along an optical axis of the set of projection optics. In another embodiment, the method includes a step 904 of measuring the position of the unsegmented pattern image associated with the particular asymmetric segmented pattern element using a metrology tool. For example, the position of the top of the unsegmented pattern element printed on the sample. Further, the position of the unsegmented pattern element may be measured in reference to one or more additional printed pattern elements such as, but not limited to, a focus-insensitive pattern element or a pattern element with a position configured to vary in an opposite direction to the unsegmented pattern element. In another embodiment, the method includes a step 906 of determining a location of the sample along an optical axis of the set of projection optics associated with the generation of the image of the lithography mask on the sample based on the measured position of the unsegmented element. For example, the controller 118 of system 100 may be used, but is not required to be used, to determine the location of the sample along the optical axis of the set of projection optics.

Referring again to FIGS. 1A through 1C, the illumination source 102 may include any illumination source known in the art suitable for generating an illumination beam 104. For example, the illumination source 102 may include, but is not limited to, a monochromatic light source (e.g. a laser), a polychromatic light source with a spectrum including two or more discrete wavelengths, a broadband light source, or a wavelength-sweeping light source. Further, the illumination source 102 may, but is not limited to, be formed from a white light source (e.g. a broadband light source with a spectrum including visible wavelengths), an laser source, a free-form illumination source, a single-pole illumination source, a multi-pole illumination source, an arc lamp, an electrodeless lamp, or a laser sustained plasma (LSP) source. Further, the illumination beam 104 may be delivered via free-space propagation or guided light (e.g. an optical fiber, a light pipe, or the like).

In another embodiment, the system 100 includes a sample stage 114 suitable for securing a sample 112. The sample stage 114 may include any sample stage architecture known in the art. For example, the sample stage 114 may include, but is not limited to, a linear stage. By way of another example, the sample stage 114 may include, but is not limited to, a rotational stage. Further, the sample 112 may include a wafer, such as, but not limited to, a semiconductor wafer.

In another embodiment, the angle of incidence of the illumination beam 104 on the sample 112 is adjustable. For example, the path of the illumination beam 104 through the beamsplitter 126 and the objective lens 128 may be adjusted to control the angle of incidence of the illumination beam 104 on the sample 112. In this regard, the illumination beam 104 may have a nominal path through the beamsplitter 126 and the objective lens 128 such that the illumination beam 104 has a normal incidence angle on the sample 112. Further, the angle of incidence of the illumination beam 104 on the sample 112 may be controlled by modifying the position and/or angle of the illumination beam 104 on the beamsplitter 126 (e.g. by rotatable mirrors, a spatial light modulator, a free-form illumination source, or the like).

The one or more processors 119 of a controller 118 may include any processing element known in the art. In this sense, the one or more processors 119 may include any microprocessor-type device configured to execute algorithms and/or instructions. In one embodiment, the one or more processors 119 may consist of a desktop computer, mainframe computer system, workstation, image computer, parallel processor, or any other computer system (e.g., networked computer) configured to execute a program configured to operate the system 100, as described throughout the present disclosure. It is further recognized that the term "processor" may be broadly defined to encompass any device having one or more processing elements, which execute program instructions from a non-transitory memory medium 120. Further, the steps described throughout the present disclosure may be carried out by a single controller 118 or, alternatively, multiple controllers 118. Additionally, the controller 118 may include one or more controllers 118 housed in a common housing or within multiple housings. In this way, any controller or combination of controllers may be separately packaged as a module suitable for integration into system 100.

The memory medium 120 may include any storage medium known in the art suitable for storing program instructions executable by the associated one or more processors 119. For example, the memory medium 120 may include a non-transitory memory medium. By way of another example, the memory medium 120 may include, but is not limited to, a read-only memory, a random access memory, a magnetic or optical memory device (e.g., disk), a magnetic tape, a solid state drive and the like. It is further noted that memory medium 120 may be housed in a common controller housing with the one or more processors 119. In one embodiment, the memory medium 120 may be located remotely with respect to the physical location of the one or more processors 119 and controller 118. For instance, the one or more processors 119 of controller 118 may access a remote memory (e.g., server), accessible through a network (e.g., internet, intranet and the like). Therefore, the above description should not be interpreted as a limitation on the present invention but merely an illustration.

In another embodiment, the controller 118 directs the illumination source 102 to provide one or more selected wavelengths of illumination (e.g. in response to feedback). In a general sense, the controller 118 may be communicatively coupled with any element within the metrology sub-system 101. In another embodiment, the controller 118 is communicatively coupled to the optical components 162 and/or the illumination source 102 to direct the adjustment of the angle of incidence between the illumination beam 104 and the sample 112. Further, the controller 118 may analyze data received from the detector 130 and feed the data to additional components within the metrology sub-system 101 or external to the system 100.

Embodiments of the present disclosure may incorporate any type of metrology system known in the art including, but not limited to, a spectroscopic ellipsometer with one or more angles of illumination, a spectroscopic ellipsometer for measuring Mueller matrix elements (e.g. using rotating compensators), a single-wavelength ellipsometer, an angle-resolved ellipsometer (e.g. a beam-profile ellipsometer), a spectroscopic reflectometer, a single-wavelength reflectometer, an angle-resolved reflectometer (e.g. a beam-profile reflectometer), an imaging system, a pupil imaging system, a spectral imaging system, or a scatterometer. Further, the metrology system may include a single metrology tool or multiple metrology tools. A metrology system incorporating multiple metrology tools is generally described in U.S. Pat. No. 7,478,019. Focused beam ellipsometry based on primarily reflective optics is generally described in U.S. Pat. No. 5,608,526, which is incorporated herein by reference in its entirety. The use of apodizers to mitigate the effects of optical diffraction causing the spread of the illumination spot beyond the size defined by geometric optics is generally described in U.S. Pat. No. 5,859,424, which is incorporated herein by reference in its entirety. The use of high-numerical-aperture tools with simultaneous multiple angle-of-incidence illumination is generally described by U.S. Pat. No. 6,429,943, which is incorporated herein by reference in its entirety.

It is further recognized herein that a metrology tool may measure characteristics of one or more targets such as, but not limited to, critical dimensions (CD), overlay, sidewall angles, film thicknesses, or process-related parameters (e.g. focus, dose, and the like). The targets may include certain regions of interest that are periodic in nature, such as for example gratings in a memory die. The metrology targets may further possess various spatial characteristics and are typically constructed of one or more cells which may include features in one or more layers which may have been printed in one or more lithographically distinct exposures. The targets or the cells may possess various symmetries such as two-fold or four-fold rotation symmetry, reflection symmetry. Examples of such metrology structures are described in U.S. Pat. No. 6,985,618, which is incorporated herein by reference in its entirety. Different cells or combinations of cells may belong to distinct layers or exposure steps. The individual cells may comprise either isolated non-periodic features or alternately they may be constructed from one, two or three dimensional periodic structures or combinations of non-periodic and periodic structures. The periodic structures may be non-segmented or they may be constructed from finely segmented features which may at or close to the minimum design rule of the lithographic process used to print them. The metrology targets may also be collocated or in close proximity with dummification structures in the same layer or in a layer above, below or in between the layers of the metrology structures. Targets can include multiple layers (e.g. films) whose thicknesses can be measured by the metrology tool. Targets can include target designs placed on the semiconductor wafer for use (e.g., with alignment, overlay registration operations, and the like). Further, targets may be located at multiple sites on the semiconductor wafer. For example, targets may be located within scribe lines (e.g., between dies) and/or located in the die itself. Multiple targets may be measured simultaneously or serially by the same or multiple metrology tools as described in U.S. Pat. No. 7,478,019, which is incorporated herein by reference in its entirety.

The herein described subject matter sometimes illustrates different components contained within, or connected with, other components. It is to be understood that such depicted architectures are merely exemplary, and that in fact many other architectures can be implemented which achieve the same functionality. In a conceptual sense, any arrangement of components to achieve the same functionality is effectively "associated" such that the desired functionality is achieved. Hence, any two components herein combined to achieve a particular functionality can be seen as "associated with" each other such that the desired functionality is achieved, irrespective of architectures or intermedial components. Likewise, any two components so associated can also be viewed as being "connected", or "coupled", to each other to achieve the desired functionality, and any two components capable of being so associated can also be viewed as being "couplable", to each other to achieve the desired functionality. Specific examples of couplable include but are not limited to physically interactable and/or physically interacting components and/or wirelessly interactable and/or wirelessly interacting components and/or logically interactable and/or logically interacting components.

It is believed that the present disclosure and many of its attendant advantages will be understood by the foregoing description, and it will be apparent that various changes may be made in the form, construction and arrangement of the components without departing from the disclosed subject matter or without sacrificing all of its material advantages. The form described is merely explanatory, and it is the intention of the following claims to encompass and include such changes. Furthermore, it is to be understood that the invention is defined by the appended claims.

What is claimed:

1. A lithography mask, comprising:
 at least one asymmetric segmented pattern element, wherein an asymmetric segmented pattern element includes at least two segments, wherein a distance between adjacent segments of the asymmetric segmented pattern element is smaller than a resolution of a set of projection optics for generating an image of the asymmetric segmented pattern element on a sample such that the image of the asymmetric segmented pattern element is an unsegmented pattern image, wherein a position of the unsegmented pattern image on the sample is indicative of a location of the sample along an optical axis of the set of projection optics, wherein the at least one asymmetric segmented pattern element is configured to form an unsegmented feature such that the at least two segments of the asymmetric segmented pattern element contribute to one or more dimensions of the unsegmented feature formed on the sample via the unsegmented pattern image, wherein the unsegmented feature comprises a portion of one or more focus-sensitive overlay metrology targets, wherein the one or more focus-sensitive overlay metrology targets are formed from the at least two segments of the at least one asymmetric segmented pattern element, wherein the at least two segments comprise one or more asymmetric scattering bars and one or more imaging-based overlay target patterns.

2. The lithography mask of claim 1, further comprising:
at least one additional pattern element different than the asymmetric segmented pattern element.

3. The lithography mask of claim 2, wherein a position of an image of the at least one additional pattern element on the sample generated by the set of projection optics is constant with respect to the location of the sample along the optical axis of the set of projection optics.

4. The lithography mask of claim 3, wherein the at least one additional pattern element comprises:
at least one of an unsegmented pattern element or a symmetric segmented pattern element.

5. The lithography mask of claim 2, wherein the at least one additional pattern element is an additional asymmetric segmented pattern element, wherein a distance between adjacent segments of an additional pattern element is configurable to be smaller than the resolution of the set of projection optics such that an image of the additional pattern element on the sample generated by the set of projection optics is an additional unsegmented pattern image, wherein a position of the additional unsegmented pattern image on the sample is indicative of the location of the sample along the optical axis of the set of projection optics, wherein a deviation of sample along the optical axis of the set of projection optics generates a deviation of the position of the unsegmented pattern image along a first direction and a deviation of the additional unsegmented pattern image along a second direction opposite the first direction.

6. The lithography mask of claim 2, wherein the at least one asymmetric segmented pattern element includes two or more segmented pattern elements distributed across a plurality of cell structures, wherein the at least one additional pattern element includes two or more additional pattern elements distributed across the plurality of cell structures.

7. The lithography mask of claim 1, wherein the at least one asymmetric segmented pattern element comprises a substantially opaque material.

8. The lithography mask of claim 7, wherein the substantially opaque material includes a metal.

9. The lithography mask of claim 1, wherein the at least one asymmetric segmented pattern element comprises a binary pattern element.

10. A lithography system, comprising:
a mask support device configured to secure a lithography mask, wherein the lithography mask includes at least one asymmetric segmented pattern element, wherein a asymmetric segmented pattern element includes at least two segments;
an illumination source configured to direct illumination to the lithography mask; and
a set of projection optics configured to generate an image of the asymmetric segmented pattern element on a sample, wherein a separation distance between adjacent segments of the asymmetric segmented pattern element is smaller than a resolution of the set of projection optics such that the image of the asymmetric segmented pattern element is an unsegmented pattern image, wherein a position of the unsegmented pattern image on the sample is indicative of a location of the sample along an optical axis of the set of projection optics, wherein the at least one asymmetric segmented pattern element is configured to form an unsegmented feature such that the at least two segments of the asymmetric segmented pattern element contribute to one or more dimensions of the unsegmented feature formed on the sample via the unsegmented pattern image, wherein the unsegmented feature forms a portion of one or more focus-sensitive overlay metrology targets, wherein the one or more focus-sensitive overlay metrology targets are formed from the at least two segments of the at least one asymmetric segmented pattern element, wherein the at least two segments comprise one or more asymmetric scattering bars and one or more imaging-based overlay target patterns.

11. The lithography system of claim 10, wherein the lithography mask further comprises:
at least one additional pattern element different than the asymmetric segmented pattern element.

12. The lithography system of claim 11, wherein a position of an image of the at least one additional pattern element on the sample generated by the set of projection optics is constant with respect to the location of the sample along the optical axis of the set of projection optics.

13. The lithography system of claim 12, wherein the at least one additional pattern element comprises:
at least one of an unsegmented pattern element or a symmetric segmented pattern element.

14. The lithography system of claim 11, wherein the at least one additional pattern element is an additional asymmetric segmented pattern element, wherein a distance between adjacent segments of an additional pattern element is configurable to be smaller than the resolution of the set of projection optics such that an image of the additional pattern element on the sample generated by the set of projection optics is an additional unsegmented pattern image, wherein a position of the additional unsegmented pattern image on the sample is indicative of the location of the sample along the optical axis of the set of projection optics, wherein a deviation of sample along the optical axis of the set of projection optics generates a deviation of the position of the unsegmented pattern image along a first direction and a deviation of the additional unsegmented pattern image along a second direction opposite the first direction.

15. The lithography system of claim 11, wherein the at least one asymmetric segmented pattern element includes two or more segmented pattern elements distributed across a plurality of cell structures, wherein the at least one additional pattern element includes two or more additional pattern elements distributed across the plurality of cell structures.

16. The lithography system of claim 10, wherein the at least one asymmetric segmented pattern element comprises a substantially opaque material.

17. The lithography system of claim 16, wherein the substantially opaque material includes a metal.

18. The lithography system of claim 10, wherein the at least one asymmetric segmented pattern element comprises a binary pattern element.

19. A metrology system, comprising:
a sample stage configured to support a substrate with a metrology target disposed upon the substrate, wherein the metrology target is associated with an image of a lithography mask, wherein the lithography mask includes at least one asymmetric segmented pattern element, wherein an asymmetric segmented pattern element includes at least two segments, wherein a distance between adjacent segments of the asymmetric segmented pattern element is smaller than a resolution of a set of projection optics for generating an image of the asymmetric segmented pattern element on a sample such that the image of the asymmetric segmented pattern element is an unsegmented pattern image, wherein a position of the unsegmented pattern image on the sample is indicative of a location of the sample along an optical axis of the set of projection optics, wherein the at least one asymmetric segmented pattern element is configured to form an unsegmented feature such that the at least two segments of the asymmetric segmented pattern element contribute to one or more dimensions of the unsegmented feature formed on the sample via the unsegmented pattern image, wherein the unsegmented feature forms a portion of one or more focus-sensitive overlay metrology targets, wherein the one or more focus-sensitive overlay metrology targets are formed from the at least two segments of the at least one asymmetric segmented pattern element, wherein the at least two segments comprise one or more asymmetric scattering bars and one or more imaging-based overlay target patterns;

at least one illumination source configured to illuminate the metrology target;

at least one detector configured to receive illumination from the metrology target; and at least one controller communicatively coupled to the detector and configured to determine the location of the sample along the optical axis of the set of projection optics based on the position of the unsegmented pattern image.

20. The metrology system of claim 19, wherein the illumination from the metrology target includes at least one of reflected illumination, scattered illumination, or emitted illumination.

21. The metrology system of claim 19, wherein the lithography mask further comprises:

at least one additional pattern element different than the asymmetric segmented pattern element.

22. The metrology system of claim 21, wherein a position of an image of the at least one additional pattern element on the sample generated by the set of projection optics is constant with respect to the location of the sample along the optical axis of the set of projection optics.

23. The metrology system of claim 22, wherein the metrology target is a grating-over-grating metrology target, wherein the unsegmented pattern image is associated with a first layer of the grating-over-grating metrology target, wherein the image of the at least one additional pattern element is associated with a second layer of the grating-over-grating target.

24. The metrology system of claim 22, wherein the at least one additional pattern element comprises:

at least one of an unsegmented pattern element or a symmetric segmented pattern element.

25. The metrology system of claim 21, wherein the at least one additional pattern element is an additional asymmetric segmented pattern element, wherein a distance between adjacent segments of an additional pattern element is configurable to be smaller than the resolution of the set of projection optics such that an image of the additional pattern element on the sample generated by the set of projection optics is an additional unsegmented pattern image, wherein a position of the additional unsegmented pattern image on the sample is indicative of the location of the sample along the optical axis of the set of projection optics, wherein a deviation of sample along the optical axis of the set of projection optics generates a deviation of the position of the unsegmented pattern image along a first direction and a deviation of the additional unsegmented pattern image along a second direction opposite the first direction.

26. The metrology system of claim 21, wherein the at least one asymmetric segmented pattern element includes two or more segmented pattern elements distributed across a plurality of cell structures, wherein the at least one additional pattern element includes two or more additional pattern elements distributed across the plurality of cell structures.

27. The metrology system of claim 19, wherein the at least one asymmetric segmented pattern element comprises a substantially opaque material.

28. The metrology system of claim 27, wherein the substantially opaque material includes a metal.

29. The metrology system of claim 19, wherein the at least one asymmetric segmented pattern element comprises a binary pattern element.

30. A method for determining a position of a sample along an optical axis of a lithography system, comprising:

generating an image of a lithography mask with a set of projection optics, wherein the lithography mask includes at least one asymmetric segmented pattern element, wherein an asymmetric segmented pattern element includes at least two segments, wherein a distance between adjacent segments of the asymmetric segmented pattern element is smaller than a resolution of the set of projection optics for generating an image of the asymmetric segmented pattern element on a sample such that the image of the asymmetric segmented pattern element is an unsegmented pattern image, wherein a position of the unsegmented pattern image on the sample is indicative of a location of the sample along an optical axis of the set of projection optics, wherein the at least one asymmetric segmented pattern element is configured to form an unsegmented feature such that the at least two segments of the asymmetric segmented pattern element contribute to one or more dimensions of the unsegmented feature formed on the sample via the unsegmented pattern image, wherein the unsegmented feature forms a portion of one or more focus-sensitive overlay metrology targets, wherein the one or more focus-sensitive overlay metrology targets are formed from the at least two segments of the at least one asymmetric segmented pattern element, wherein the at least two segments comprise one or more asymmetric scattering bars and one or more imaging-based overlay target patterns;

measuring the position of the unsegmented pattern image associated with the asymmetric segmented pattern element using a metrology tool; and determining the location of the sample along the optical axis of the set of projection optics based on the measured position of the unsegmented pattern image.

* * * * *